United States Patent
Hirose et al.

(10) Patent No.: US 8,936,858 B2
(45) Date of Patent: Jan. 20, 2015

(54) ORGANIC ELECTROLUMINESCENT ELEMENT AND DISPLAY

(75) Inventors: Hidekazu Hirose, Kanagawa (JP); Takeshi Agata, Kanagawa (JP); Katsuhiro Sato, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 417 days.

(21) Appl. No.: 13/414,389

(22) Filed: Mar. 7, 2012

(65) Prior Publication Data
US 2013/0032790 A1 Feb. 7, 2013

(30) Foreign Application Priority Data

Aug. 1, 2011 (JP) .................................. 2011-168828

(51) Int. Cl.
H01L 51/54 (2006.01)
H01L 51/00 (2006.01)
H01L 51/50 (2006.01)

(52) U.S. Cl.
CPC ........ H01L 51/0036 (2013.01); H01L 51/0035 (2013.01); H01L 51/5012 (2013.01); Y10S 428/917 (2013.01)
USPC ............ 428/690; 428/917; 313/504; 313/506

(58) Field of Classification Search
None
See application file for complete search history.

(56) References Cited

U.S. PATENT DOCUMENTS 7,361,574 B1  4/2008  Maa et al.
7,455,916 B2 * 11/2008  Hirose et al. ................. 428/690

(Continued)

FOREIGN PATENT DOCUMENTS

JP  A-10-092576  4/1998
JP  A-2002-043066  2/2002

OTHER PUBLICATIONS

Vincett et al., "Electrical Conduction and Low Voltage Blue Electroluminescence in Vacuum-Deposited Organic Films", *Thin Solid Films*, 1982, pp. 171-183, No. 94, Elsevier Sequoia, Netherlands.

(Continued)

*Primary Examiner* — Dawn Garrett
(74) *Attorney, Agent, or Firm* — Oliff PLC

(57) ABSTRACT

Provided is an organic electroluminescent element which includes a pair of electrodes composed of a positive electrode and a negative electrode, with at least one of the electrodes being transparent or semi-transparent, and an organic compound layer interposed between the pair of electrodes and containing one or more charge transporting polyesters represented by the following formula (I) [in the formula (I), $A^1$ represents at least one selected from structures represented by the following formula (II); and in the formula (II), X represents a group represented by the following formula (III)]:

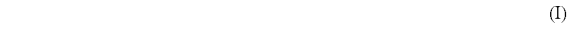

(I)

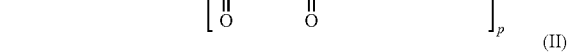

(II)

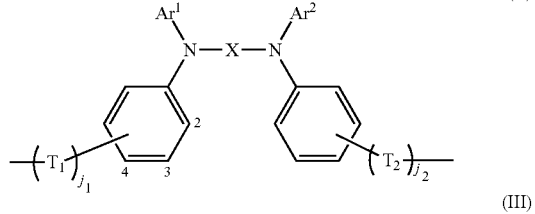

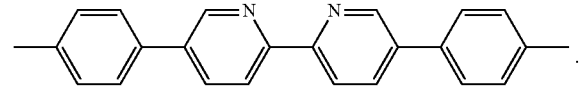

(III)

14 Claims, 2 Drawing Sheets

(56) References Cited

U.S. PATENT DOCUMENTS

| | | |
|---|---|---|
| 8,741,515 B2 * | 6/2014 | Hirose et al. .......... 430/75 |
| 2003/0170965 A1 | 9/2003 | Kondo |
| 2007/0023805 A1 | 2/2007 | Wells et al. |

OTHER PUBLICATIONS

Gustafsson et al., "Flexible light-emitting diodes made from soluble conducting polymers", *Letters to Nature*, 1992, pp. 477-479, vol. 357.

Proceedings of $42^{nd}$ Symposium on Macromolecules 20J-21, 1993, Japan.

Mori et al., "Organic electroluminescent devices with a mixed-layer structure", *Proceedings of the $38^{th}$ Meeting of the Japan Society of Applied Physics and Related Societies*, 1991, pp. 1086, 31p-G-12, Japan.

Mori et al., "Preparation of organic EL device by casting method", *Proceedings of the $50^{th}$ Symposium of the Japan Society of Applied Physics*, 1989, pp. 1006, 29p-ZP-5, Japan.

Fijii et al., "Organic EL Device using Cast Polymer Film as Hole Transport Layer", *Proceedings of the $51^{st}$ Symposium of the Japan Society of Applied Physics*, 1990, pp. 1041, 28a-PB-7, Japan.

Nov. 10, 2014 Office Action issued in U.S Appl. No. 13/365,794.

* cited by examiner

ORGANIC ELECTROLUMINESCENT ELEMENT AND DISPLAY

CROSS-REFERENCE TO RELATED APPLICATIONS

This application is based on and claims priority under 35 USC 119 from Japanese Patent Application No. 2011-168828 filed Aug. 1, 2011.

BACKGROUND

1. Technical Field

The present invention relates to an organic electroluminescent element and a display.

2. Related Art

Electroluminescent elements are self-luminescent, all-solid elements. Research on electroluminescent elements using organic compounds was started initially by using single crystals of anthracene or the like.

The light emission of these elements is a phenomenon in which, when electrons are injected from one of the electrodes, and holes are injected from the other electrode, the luminescent material in the electroluminescent element is excited to a higher energy level, and the excess energy occurring when the excited luminescent body returns to the ground state, is emitted as light.

In regard to organic electroluminescent elements, research and development has been conducted in recent years also on electroluminescent elements which use polymer materials instead of low molecular weight compounds.

SUMMARY

According to an aspect of the present invention, there is provided an organic electroluminescent element including: a pair of electrodes including a positive electrode and a negative electrode, with at least one of the electrodes being transparent or semi-transparent; and an organic compound layer interposed between the pair of electrodes, containing one or more charge transporting polyesters represented by the following formula (I):

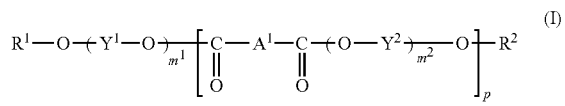

In the formula (I), represents at least one selected from structures represented by the following formula (II); $Y^1$ and $Y^2$ each independently represent a substituted or unsubstituted divalent hydrocarbon group; $m^1$ and $m^2$ each independently represent an integer of from 1 to 5; p represents an integer of from 5 to 5,000; and $R^1$ and $R^2$ each independently represent a hydrogen atom, an alkyl group, a substituted or unsubstituted aryl group, or a substituted or unsubstituted aralkyl group:

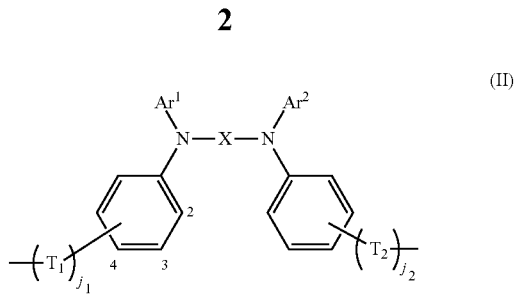

In the formula (II), $Ar^1$ and $Ar^2$ each independently represent a substituted or unsubstituted phenyl group, a substituted or unsubstituted monovalent polynuclear aromatic hydrocarbon group having two aromatic rings, a substituted or unsubstituted monovalent condensed aromatic hydrocarbon group having two or three aromatic rings, or a substituted or unsubstituted monovalent aromatic heterocyclic group; $j_1$ and each independently represent 0 or 1; $T_1$ and $T_2$ each independently represent a divalent linear hydrocarbon group having from 1 to 6 carbon atoms, or a divalent branched hydrocarbon group having from 2 to 10 carbon atoms; and X represents a group represented by the following formula (III):

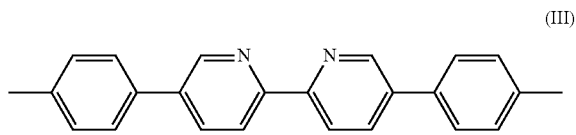

BRIEF DESCRIPTION OF THE DRAWINGS

Exemplary embodiments of the present invention will be described in detail based on the following figures, wherein.

DETAILED DESCRIPTION

Figure 1:
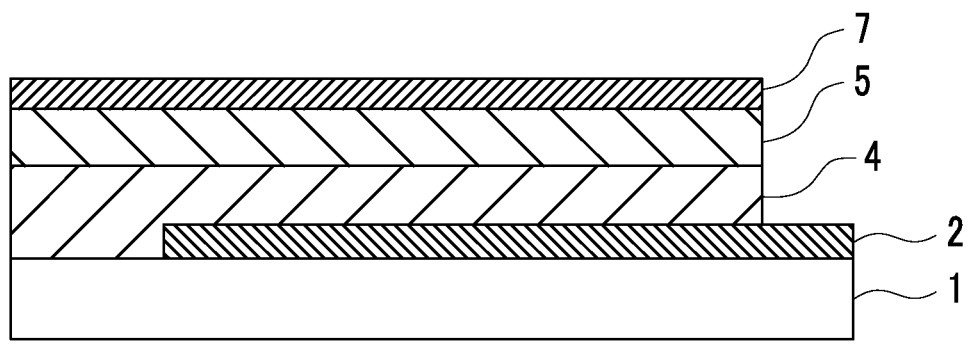
FIG. 1 is a schematic configuration diagram showing the layer configuration of an organic electroluminescent element according to an exemplary embodiment of the present invention.

Hereinafter, an exemplary embodiment of the present invention will be described in detail.

<Organic Electroluminescent Element>

The organic electroluminescent element (hereinafter, may be referred to as "organic EL element") of the exemplary embodiment of the present invention includes a pair of electrodes consisting of a positive electrode and a negative electrode, at least one of the electrodes being transparent or semi-transparent, and an organic compound layer interposed between the pair of electrodes, containing one or more charge transporting polyesters represented by the following formula (I)

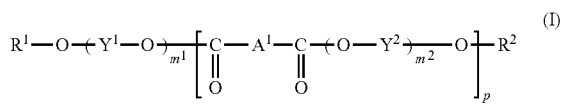

In the formula (I), $A^1$ represents at least one selected from structures represented by the following formula (II); $Y^1$ and $Y^2$ each independently represent a substituted or unsubstituted divalent hydrocarbon group; $m^1$ and $m^2$ each independently represent an integer of from 1 to 5; p represents an integer of from 5 to 5,000; and $R^1$ and $R^2$ each independently represent a hydrogen atom, an alkyl group, a substituted or unsubstituted aryl group, or a substituted or unsubstituted aralkyl group.

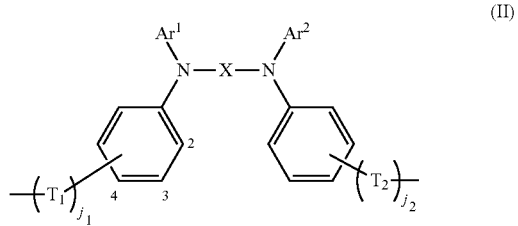

In the formula (II), $Ar^1$ and $Ar^2$ each independently represent a substituted or unsubstituted phenyl group, a substituted or unsubstituted monovalent polynuclear aromatic hydrocarbon group having two aromatic rings, a substituted or unsubstituted monovalent condensed aromatic hydrocarbon group having two or three aromatic rings, or a substituted or unsubstituted monovalent aromatic heterocyclic group; $j_1$ and $j_2$ each independently represent 0 or 1; $T_1$ and $T_2$ each independently represent a divalent linear hydrocarbon group having from 1 to 6 carbon atoms, or a divalent branched hydrocarbon group having from 2 to 10 carbon atoms; and X represents a group represented by the following formula (III):

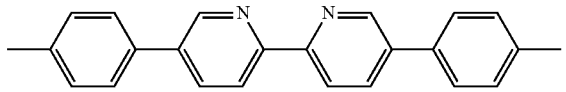

In regard to the charge transporting polyester according to the exemplary embodiment of the present invention, it is speculated that since bipyridine is included in the molecular structure, the ionization potential is controlled to a low level, and therefore, the charge injectability from the electrode is improved. Furthermore, the structure containing bipyridine described above has excellent solubility and compatibility with solvents or resins. Therefore, it is speculated that when the above-described charge transporting polyester is used, the element becomes large-sized, and organic electroluminescent elements may be easily produced.

Furthermore, the charge transporting polyester is such that by selecting the structure that will be described later, the polyester may be imparted with any function of hole transport capability and electron transport capability, and therefore, the polyester is used in any of a hole transport layer, a light emitting layer, an electron transport layer and the like according to the purpose. In addition, since the charge transporting polyester according to the exemplary embodiment of the present invention has a relatively high glass transition temperature and a large degree of charge mobility, it is speculated that current can flow easily, an increase in the voltage is suppressed, heat is not easily generated during light emission, so that the polyester has excellent stability, and has a lengthened element service life.

Also, according to the exemplary embodiment of the present invention, the term "charge transporting polyester" means a polyester which is a semiconductor capable of transporting holes or electrons as charges.

(Charge Transporting Polyester)

Hereinafter, the charge transporting polyester according to the exemplary embodiment of the present invention will be described in detail. First, the structure of $A^1$ in the formula (I), which is a feature of the charge transporting polyester, will be explained.

In the formula (II) shown above, $Ar^1$ and $Ar^2$ each independently represent a substituted or unsubstituted phenyl group, a substituted or unsubstituted monovalent polynuclear aromatic hydrocarbon group having two aromatic rings, a substituted or unsubstituted monovalent condensed aromatic hydrocarbon group having two or three aromatic rings, or a substituted or unsubstituted monovalent aromatic heterocyclic group. Meanwhile, $Ar^1$ and $Ar^2$ present in the formula (II) may be identical with or different from each other, but when $Ar^1$ and $Ar^2$ are identical, production is facilitated.

Here, the polynuclear aromatic hydrocarbon group and the condensed aromatic hydrocarbon group according to the exemplary embodiment of the present invention specifically mean groups having polycyclic aromatic rings defined below (that is, a polynuclear aromatic hydrocarbon or condensed aromatic hydrocarbon).

That is, the term "polynuclear aromatic hydrocarbon" means a hydrocarbon in which two or more aromatic rings each composed of carbon and hydrogen are present, and the rings are bonded through carbon-carbon bonding. Specific examples include biphenyl. Furthermore, the term "condensed aromatic hydrocarbon" means a hydrocarbon compound in which two or more aromatic rings are each composed of carbon and hydrogen, and these aromatic rings share a pair of carbon atoms that are adjacently bonded. Specific examples include naphthalene, anthracene, phenanthrene, and fluorene.

Furthermore, according to the exemplary embodiment of the present invention, the aromatic heterocyclic group selected as a structure representing $Ar^1$ and $Ar^2$ in the formula (II) means a group having an aromatic heterocyclic ring defined below.

That is, the term "aromatic heterocyclic ring" means an aromatic ring which also contains elements other than carbon and hydrogen, and for example, compounds in which the number of atoms (Nr) constituting the ring skeleton is at least any one of 5 and 6. Furthermore, the type and number of atoms other than the carbon atoms constituting the ring skeleton (heteroatoms) are not particularly limited, but for example, a sulfur atom, a nitrogen atom, an oxygen atom and the like are used. Thus, the ring skeleton may contain at least any of two or more kinds of heteroatoms and two or more heteroatoms. Particularly, as a heterocyclic ring having a 5-membered ring structure, for example, thiophene, pyrrole, furan, and heterocyclic rings in which the carbon at the 3-position and the 4-position of the above-described compounds are substituted with nitrogen, are used, and as a heterocyclic ring having a 6-membered ring structure, for example, pyridine is used.

Furthermore, it is sufficient that the aromatic heterocyclic group have the aromatic heterocyclic ring described above, and the aromatic heterocyclic group contain, in addition to the group constituted of the aromatic heterocyclic ring, both a group in which an aromatic ring is substituted with the aromatic heterocyclic ring, and a group in which the aromatic heterocyclic ring is substituted with an aromatic ring. Specific examples of the aromatic ring include those aromatic rings described above.

That is, the aromatic heterocyclic group may be, for example, a group of the polycyclic aromatic ring described above (that is, a monovalent polynuclear aromatic hydrocarbon having two or more aromatic rings, or a monovalent condensed aromatic hydrocarbon having two or more aromatic rings), in which one or more aromatic rings are substituted with an aromatic heterocyclic ring, and specific examples include a thiophenylphenyl group, a phenylpyridine group, and a phenylpyrrole group.

In formula (II), examples of the substituent used to further substitute the phenyl group, polynuclear aromatic hydrocarbon group, condensed aromatic hydrocarbon group and aromatic heterocyclic group that are represented by $Ar^1$ and $Ar^2$, include a hydrogen atom, an alkyl group, an alkoxy group, an aryl group, an aralkyl group, a substituted amino group, and a halogen atom.

The alkyl group may be, for example, an alkyl group having from 1 to 10 carbon atoms, and examples include a methyl group, an ethyl group, a propyl group, and an isopropyl group.

The alkoxy group may be, for example, an alkoxy group having from 1 to 10 carbon atoms, and examples include a methoxy group, an ethoxy group, a propoxy group, and an isopropoxy group.

The aryl group may be, for example, an aryl group having from 6 to 20 carbon atoms, and examples include a phenyl group and a toluoyl group.

The aralkyl group may be, for example, an aralkyl group having from 7 to 20 carbon atoms, and examples include a benzyl group and a phenethyl group.

Examples of the substituent of the substituted amino group include an alkyl group, an aryl group and an aralkyl group, and specific examples are as described above.

In formula (II), $T_1$ and $T_2$ each independently represent a divalent linear hydrocarbon group having from 1 to 6 carbon atoms, or a divalent branched hydrocarbon group having from 2 to 10 carbon atoms, and among them, examples include a divalent linear hydrocarbon group having from 2 to 6 carbon atoms and a divalent branched hydrocarbon group having from 3 to 7 carbon atoms. Among these, more specific examples include, in particular, divalent hydrocarbon groups shown below.

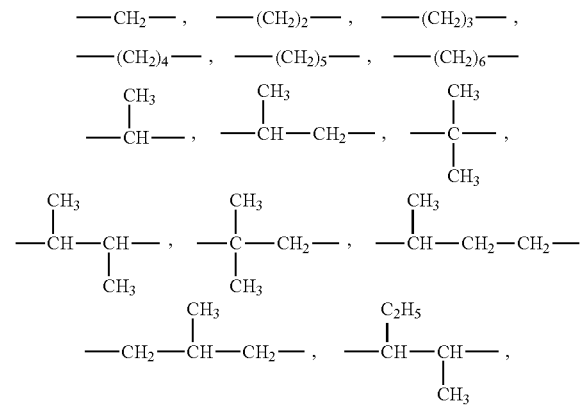

In formula (II), and $j_2$ each independently represent 0 or 1.

In addition, $T_1$ and $T_2$ and $j_1$ and $j_2$ that are respectively present in the formula (II), may be identical with or different from each other, but when $T_1$ and $T_2$ and $j_1$ and $j_2$ are identical, the production of the charge transporting polyester is much easier.

The at least one selected from the structures represented by the formula (II) explained above is $A^1$ in the charge transporting polyester represented by formula (I).

In addition, the plural $A^1$s present in the charge transporting polyester represented by the formula (I) may have the same structure or may have different structures.

In the formula (I), $Y^1$ and $Y^2$ each independently represent a substituted or unsubstituted divalent hydrocarbon group. The divalent hydrocarbon group represented by $Y^1$ and $Y^2$ is a divalent alcohol residue, and examples include an alkylene group, a (poly) ethyleneoxy group, a (poly) propyleneoxy group, an arylene group, a divalent heterocyclic group and combinations thereof. The carbon number of the divalent hydrocarbon group represented by $Y^1$ and $Y^2$ may be, for example, in the range of from 1 to 18, and the carbon number may also be in the range of from 1 to 6.

That is specific examples of the divalent hydrocarbon group represented by $Y^1$ and $Y^2$ include an alkylene group having from 1 to 10 carbon atoms, and an arylene group having from 6 to 18 carbon atoms, and the divalent hydrocarbon group may also be an alkylene group having from 1 to 5 carbon atoms.

Specific examples of $Y^1$ and $Y^2$ include groups selected from among the following formulas (IV-1) to (IV-8).

Meanwhile, $Y^1$ and $Y^2$ present in the charge transporting polyester represented by the formula (I) may be identical with or different from each other.

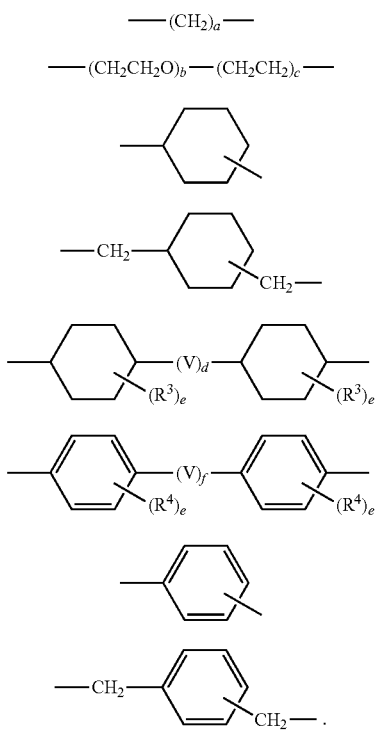

In the formulas (IV-1), (IV-2), (IV-5) and (IV-6), $R^3$ and $R^4$ each independently represent a hydrogen atom, a substituted or unsubstituted alkyl group having from 1 to 4 carbon atoms, a substituted or unsubstituted alkoxy group having from 1 to 4 carbon atoms, a substituted or unsubstituted phenyl group, a substituted or unsubstituted aralkyl group, or a halogen atom; a, b and c each independently represent an integer from 1 to 10; e represents an integer of from 0 to 2; d and f each represent 0 or 1; and V represents a group represented by the following formulas (V-1) to (V-12):

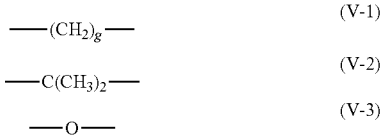

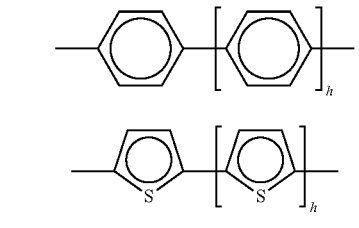

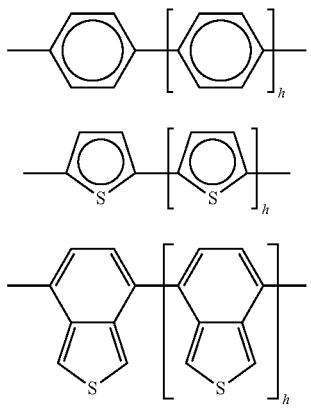

In the formulas (V-1), (V-10), (V-11) and (V-12), g represents an integer of from 1 to 20; and h represents an integer of from 0 to 10.

In the formula (I), $m^1$ and $m^2$ each independently represent an integer of from 1 to 5, and $m^1$ and $m^2$ present in the charge transporting polyester represented by the formula (I) may be identical with or different from each other.

In the formula (I), $R^1$ and $R^2$ each independently represent a hydrogen atom, an alkyl group, a substituted or unsubstituted aryl group, or a substituted or unsubstituted aralkyl group. Specific examples of the alkyl group, aryl group and aralkyl group as well as the substituents substituting these groups are the same as the specific examples mentioned as the substituents substituting the aromatic ring of Ar.

Furthermore, in the formula (I), $R^1$ and $R^2$ may be a hydrogen atom or a phenyl group among those, substituents described above, and from the viewpoints of cost reduction and the ease of production, $R^1$ and $R^2$ may be a hydrogen atom. $R^1$ and $R^2$ in the formula (I) may be identical with or different from each other, but when $R^1$ and $R^2$ are identical, the production of the polymer is easier.

In the formula (I), p represents an integer of from 5 to 5,000, but may also be in the range of from 10 to 1,000.

More specifically, the weight average molecular weight Mw of the charge transporting polyester may be, for example, in the range of from 5,000 to 300,000, and may also be in the range of from 10,000 to 100,000.

The weight average molecular weight Mw is measured by the following method. That is, the weight average molecular weight is measured by preparing a 1.0% by weight tetrahydrofuran solution of the charge transporting polyester, and performing gel permeation chromatography (GPC) using a differential refractive index detector (RI) and using styrene polymers as standard samples.

Furthermore, the glass transition temperature (Tg) of the charge transporting polyester may be, for example, from 60° C. to 300° C., and may also be from 100° C. to 200° C.

Meanwhile, the glass transition temperature is measured with a differential scanning calorimeter using $\alpha$-$Al_2O_3$ as a reference, by increasing the temperature of the sample to a rubbery state, immersing the sample in liquid nitrogen to quench the sample, and then increasing the temperature of the sample again under the conditions of a rate of temperature increase of 10° C./min.

The charge transporting polyester represented by the formula (I) is synthesized by, for example, polymerizing a charge transporting monomer represented by the following structural formula (VI) by a known method described in, for example, "Lectures on Experimental Chemistry, 4$^{th}$ Edition", Vol. 28 (edited by the Chemical Society of Japan, Maruzen Co., Ltd., 1992) or the like.

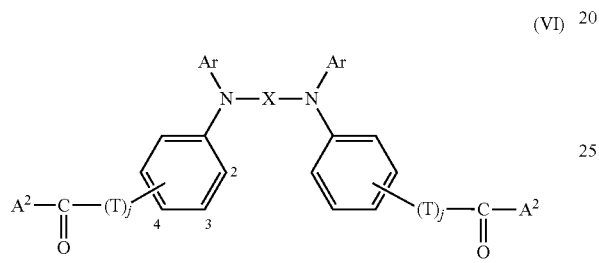

In formula (VI), Ar, X, T and j are the same as $Ar^1$ (or $Ar^2$), X, $T_1$ (or $T_2$) and $j_1$ (or $j_2$) defined for formula (II), respectively. In formula (VI), $A^2$ represents a hydroxyl group, a halogen atom, or —O—$R^5$ (wherein $R^5$ represents a substituted or unsubstituted alkyl group, a substituted or unsubstituted aryl group, or a substituted or unsubstituted aralkyl group).

Here, specific examples of the structure represented by the formula (VI) are shown in Table 1 to Table 4. In the following, for each of the specific examples of the charge transporting monomer designated with a compound number (structure number) in the following tables, for example, a specific example designated with number 5 will be denoted as "Monomer compound (5)".

In the specific examples of the charge transporting monomer shown in the following tables, Ar, T, j and $A^2$ that are present twice in the formula (VI) are respectively the same.

TABLE 1

| Structure No. | Ar | j | T | $A^2$ |
|---|---|---|---|---|
| 1 |  | 0 | — | $OCH_3$ |
| 2 | 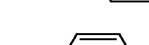 | 0 | — | $OCH_3$ |
| 3 | 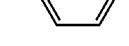 | 0 | — | $OCH_3$ |
| 4 | 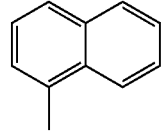 | 0 | — | $OCH_3$ |
| 5 | 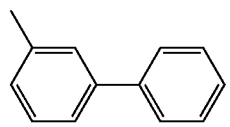 | 0 | — | $OCH_3$ |
| 6 | 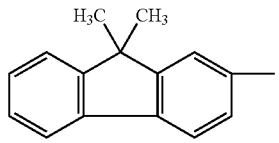 | 0 | — | $OCH_3$ |
| 7 |  | 1 | $CH_2$ | $OCH_3$ |
| 8 |  | 1 | $CH_2$ | $OCH_3$ |

TABLE 2

| Structure No. | Ar | j | T | $A^2$ |
|---|---|---|---|---|
| 9 |  | 1 | $CH_2$ | $OCH_3$ |
| 10 |  | 1 | $CH_2$ | $OCH_3$ |
| 11 |  | 1 | $CH_2$ | $OCH_3$ |
| 12 |  | 1 | $CH_2$ | $OCH_3$ |

TABLE 2-continued
| Structure No. | Ar | j | T | A² |
|---|---|---|---|---|
| 13 | 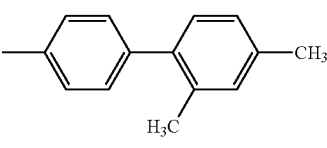 | 1 | CH₂ | OCH₃ |
| 14 | 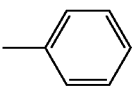 | 1 | CH₂CH₂ | OCH₃ |
| 15 | 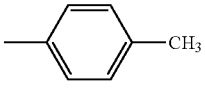 | 1 | CH₂CH₂ | OCH₃ |
| 16 | 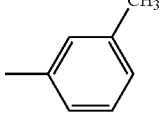 | 1 | CH₂CH₂ | OCH₃ |
TABLE 3
| Structure No. | Ar | j | T | A² |
|---|---|---|---|---|
| 17 | 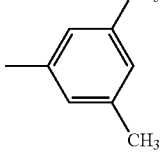 | 1 | CH₂CH₂ | OCH₃ |
| 18 | 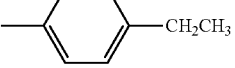 | 1 | CH₂CH₂ | OCH₃ |
| 19 | 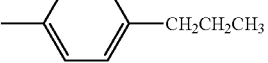 | 1 | CH₂CH₂ | OCH₃ |
| 20 | 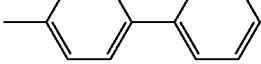 | 1 | CH₂CH₂ | OCH₃ |
| 21 | 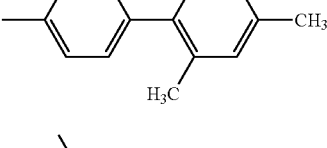 | 1 | CH₂CH₂ | OCH₃ |
| 22 | 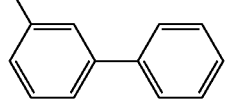 | 1 | CH₂CH₂ | OCH₃ |
| 23 | 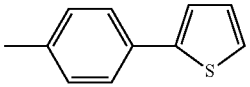 | 1 | CH₂CH₂ | OCH₃ |
TABLE 3-continued
| Structure No. | Ar | j | T | A² |
|---|---|---|---|---|
| 24 | 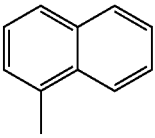 | 1 | CH₂CH₂ | OCH₃ |
TABLE 4
| Structure No. | Ar | j | T | A² |
|---|---|---|---|---|
| 25 | 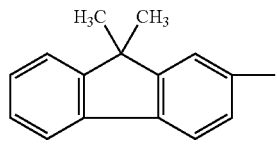 | 1 | CH₂CH₂ | OCH₃ |
| 26 | 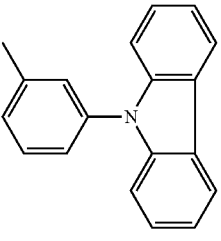 | 1 | CH₂CH₂ | OCH₃ |
| 27 | 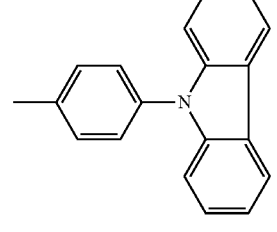 | 1 | CH₂CH₂ | OCH₃ |
| 28 | 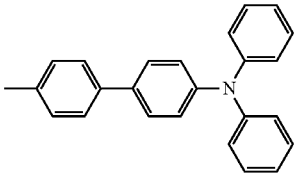 | 1 | CH₂CH₂ | OCH₃ |
| 29 | 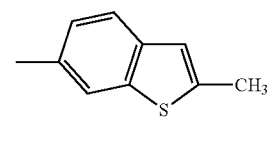 | 1 | CH₂CH₂ | OCH₃ |
| 30 | 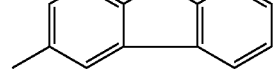 | 1 | CH₂CH₂ | OCH₃ |

TABLE 4-continued

| Structure No. | Ar | j | T | $A^2$ |
|---|---|---|---|---|
| 31 | (4-methylphenyl)(phenyl)(phenyl)amine group | 1 | $CH_2CH_2$ | $OCH_3$ |
| 32 | 9,9-di(propyl)-fluoren-2-yl ($H_3CH_2CH_2C$, $CH_2CH_2CH_3$) | 1 | $CH_2CH_2$ | $OCH_3$ |

Here, first, the method for synthesizing the charge transporting monomer represented by the formula (VI) will be described. An example of the method for synthesizing the charge transporting monomer will be shown below, but the method is not limited to this.

As the method for synthesizing the charge transporting monomer (bipyridine compound) represented by the formula (VI), for example, a method of using the cross-coupling biaryl synthesis may be mentioned. Specific examples of the cross-coupling biaryl synthesis include, for example, a Suzuki reaction, a Kharasch reaction, a Negishi reaction, a Stille reaction, a Grignard reaction, and an Ullmann reaction.

A specific example of the method for synthesizing the charge transporting monomer represented by the formula (VI) may be, for example, a synthesis method based on a cross-coupling reaction between a compound represented by formula (VII) and a compound represented by formula (VIII) as shown in the following formula, but the synthesis method is not limited to this.

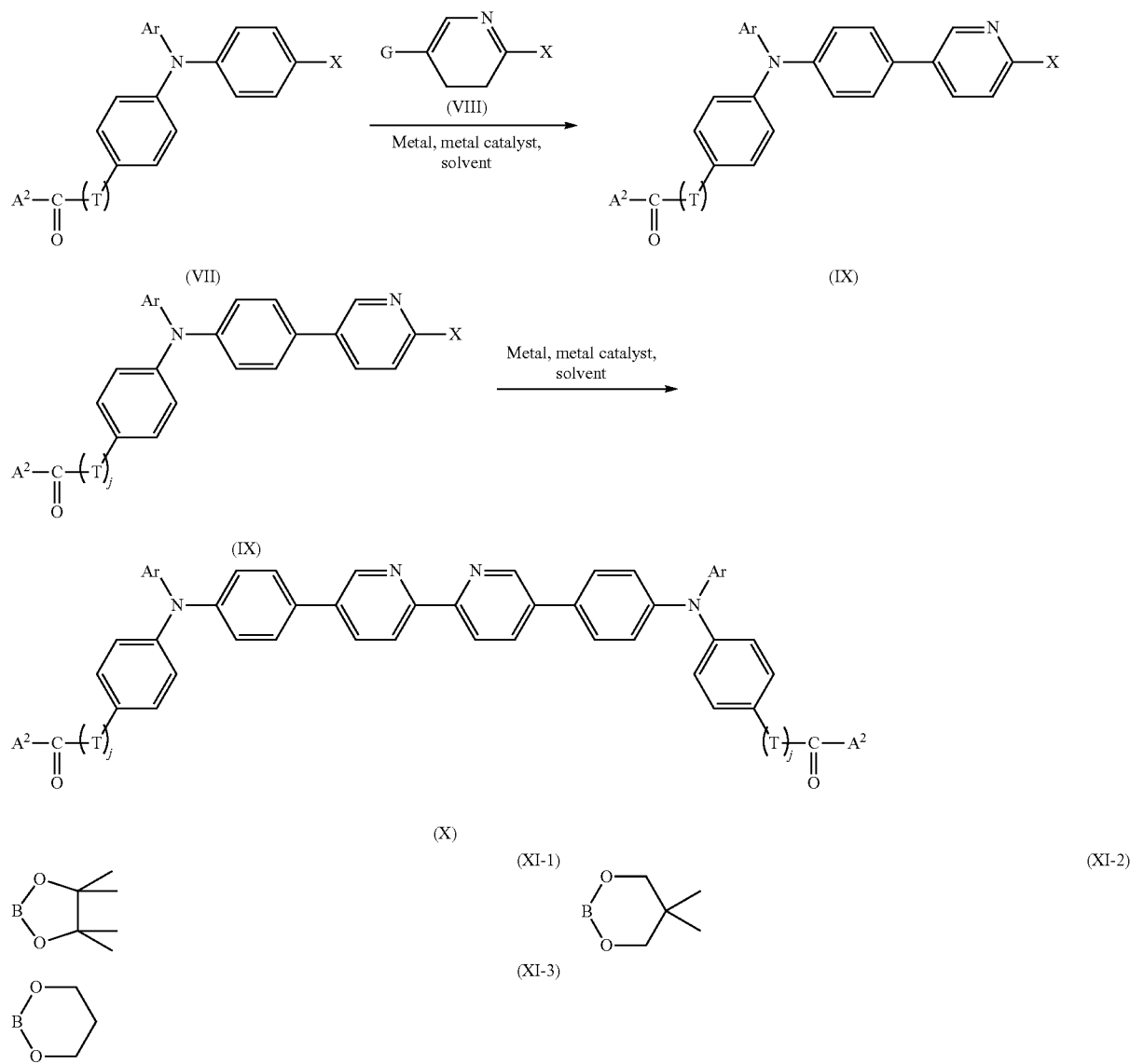

In the formula (VII), formula (VIII) and formula (IX), X and G each represent a halogen atom, $B(OH)_2$, a substituent represented by the above-shown structural formula (XI-1), a substituent represented by the above-shown structural formula (XI-2), or a substituent represented by the above-shown structural formula (XI-3). Furthermore, in the formula (VII), formula (IX) and formula (X), $A^2$, T, j and Ar respectively have the same meanings as $A^2$, T, j and Ar in the formula (VI).

Furthermore, during the reaction described above, a metal, a metal complex catalyst, a base, a solvent or the like may also be used as necessary.

Also, during the synthesis reaction, a catalyst of a metal or a metal complex, a base, a solvent, or a catalyst aid such as an organic phosphine ligand may also be used.

Examples of the metal that may be used include palladium (Pd), copper (Cu), titanium (Ti), tin (Sn), nickel (Ni), platinum (Pt) and zinc (Zn).

Examples of the metal complex that may be used include tetrakis(triphenylphosphine)palladium ($Pd(PPh_3)_4$), palladium(II) acetate ($Pd(OCOCH_3)_2$), tris(dibenzylideneacetone)dipalladium(0) ($Pd_2(dba)_3$), di(triphenylphosphine)dichloropalladium ($Pd(PPh_3)_2Cl_2$), 1,1'-bis(diphenylphosphino) ferrocene-palladium(II) dichloride-dichloromethane complex ($Pd(dppf)_2Cl_2$), Pd/C, nickel (II) acetylacetonate ($Ni(acac)_2$), and zinc chloride ($ZnCl_2$).

Examples of the base that may be used include inorganic bases such as sodium carbonate ($Na_2CO_3$), potassium carbonate ($K_2CO_3$), cesium carbonate ($Cs_2CO_3$), and barium hydroxide ($Ba(OH)_2$); and organic bases such as triethylamine ($NEt_3$), diisopropylamine ($NH(i-Pr)_2$), diethylamine ($NHEt_2$), dimethylamine ($NHMe_2$), trimethylamine ($NMe_3$) 1,8-diazabicyclo[5.4.0]-7-undecene (DBU), N,N-dimethyl-4-aminopyridine (DMAP), and pyridine.

It is preferable that the solvent be a solvent that does not significantly inhibit the reaction, and examples that may be used include aromatic hydrocarbon solvents such as benzene, toluene, xylene, and mesitylene; ether solvents such as diethyl ether, tetrahydrofuran, and dioxane; acetonitrile, dimethylformamide, dimethyl sulfoxide, methanol, ethanol, isopropyl alcohol, and water.

Furthermore, during the reaction described above, if necessary, for example, triphenylphosphine ($PPh_3$), tri-o-tolylphosphine ($P(o-Tol)_3$), tributylphosphine ($P(t-Bu)_3$), and triethylphosphine ($PEt_3$) are used.

Meanwhile, Me represents "$CH_3$"; Et represents "$C_2H_5$"; Ph represents "$C_6H_5$"; i-Pr represents "$(CH_3)_2CH_2$"; o-Tol represents "o-$CH_3C_6H_4$"; and t-Bu represents "$(CH_3)_3C$".

The reaction may be carried out, for example, under normal pressure, in an inert gas atmosphere of nitrogen, argon or the like, but the reaction may also be carried out under pressurized conditions.

The reaction temperature for the reaction may be, for example, in the range of from 20° C. to 300° C., but may also be in the range of from 50° C. to 180° C. The reaction time may vary depending on the reaction conditions, but for example, the reaction time may be selected in the range of from 5 minutes to 20 hours.

The use amount of the metal or metal complex catalyst is not particularly limited, but for example, the use amount may be in the range of from 0.001 mole to 10 moles, or may also be in the range of from 0.01 mole to 5.0 moles, based on one mole of the compound represented by formula (VII).

The use amount of the base may be in the range of from 0.5 mole to 4.0 moles, or may also be in the range of from 1.0 mole to 2.5 moles, based on one mole of the compound represented by formula (VII).

After the reaction described above, for example, the reaction solution is introduced into water, and then the mixture is stirred. When the reaction product is in the form of crystals, a crude product is obtained by collecting the reaction product by suction filtration. When the reaction product is an oily matter, for example, a crude product is obtained by extracting the reaction product with a solvent such as ethyl acetate or toluene. The crude product thus obtained may be purified using a column packed with, for example, silica gel, alumina, activated white clay or activated carbon, or the crude product may also be subjected to a treatment of adsorbing unnecessary components by adding these adsorbents to the solution. Furthermore, if the reaction product is in the form of crystals, the crystals may also be purified by recrystallization from a solvent such as hexane, methanol, acetone, ethanol, ethyl acetate or toluene.

However, the synthesis method according to the exemplary embodiment of the present invention is not intended to be limited to these.

When polymerization is carried out by a known method using the charge transporting monomer represented by the formula (VI) obtained as described above, the charge transporting polyester represented by the formula (I) is synthesized.

Specifically, for example, a method of introducing a substituent that will be described below into the end of the charge transporting monomer described above (that is, $A^2$ in formula (VI)) may be used, and more specifically, the following synthesis method may be employed.

1) In case where $A^2$ is a hydroxyl group

The compound represented by the formula (VI) and a divalent alcohol represented by HO—$(Y^1$—$O)_m$—H are mixed in equal amounts (weight ratio), and the mixture is polymerized using an acid catalyst. Meanwhile, $Y^1$ and m have the same meanings as $Y^1$ (or $Y^2$) and $m^1$ (or $m^2$) defined for the formula (I).

As the acid catalyst, those conventionally used in esterification reactions, such as sulfuric acid, toluenesulfonic acid, and trifluoroacetic acid are used, and the acid catalyst is used in an amount of, for example, from 1/10,000 part by weight to 1/10 part by weight, relative to part by weight of the monomer (that is, the compound represented by the formula (VI)). The acid catalyst may also be used in the range of from 1/1,000 part by weight to 1/50 part by weight.

In order to remove water produced during the polymerization, for example, a solvent that is azeotropically boiled with water is used. Specifically, for example, toluene, chlorobenzene, 1-chloronaphthalene and the like are effective, and the solvent is used in an amount in the range of, for example, from 1 part by weight to 100 parts by weight relative to 1 part by weight of the monomer. The solvent may also be used in an amount in the range of from 2 parts by weight to 50 parts by weight.

The reaction temperature is set according to the conditions, but in order to remove the water produced during the polymerization, the reaction may be carried out at the boiling point of the solvent.

After completion of the reaction, if a solvent has not been used, the reaction product is dissolved in a solvent which dissolves the reaction product. If a solvent has been used, the reaction solution may be directly added dropwise into a poor solvent in which a polymer is not easily dissolved, such as an alcohol such as methanol or ethanol, or acetone, to thereby precipitate a polyester. The polyester is separated, subsequently washed with water or an organic solvent, and dried.

Furthermore, if necessary, a reprecipitation treatment of dissolving the reaction product in an appropriate organic solvent, adding the solution dropwise into a poor solvent, and precipitating a polyester may be repeated. At the time of the reprecipitation treatment, the treatment may also be carried out while stirring the system efficiently with a mechanical stirrer or the like. The solvent that dissolves the polyester at the time of the reprecipitation treatment is used in an amount of, for example, from 1 part by weight to 100 parts by weight, relative to 1 part by weight of the polyester, and the solvent may also be used in an amount in the range of from 2 parts by weight to 50 parts by weight. Furthermore, the poor solvent is used in an amount in the range of, for example, from 1 part by weight to 1,000 parts by weight relative to 1 part by weight of the polyester, and may also be used in an amount in the range of from 10 parts by weight to 500 parts by weight.

2) In case where $A^2$ is halogen

The compound represented by the formula (VI) and a divalent alcohol represented by HO—$(Y^1$—O$)_m$—H are mixed in equal amounts (weight ratio), and the mixture is polymerized using an organic basic catalyst such as pyridine or triethylamine. Meanwhile, $Y^1$ and m described above have the same meanings as $Y^1$ and m defined for the formula (I).

The organic basic catalyst is used in an amount in the range of, for example, from 1 part by weight to 10 parts by weight relative to 1 part by weight of the monomer, and may also be used in an amount in the range of from 2 parts by weight to 5 parts by weight.

As the solvent, methylene chloride, tetrahydrofuran (THF), toluene, chlorobenzene, 1-chloronaphthalene and the like are effective, and the solvent is used in an amount in the range of, for example, from 1 part by weight to 100 parts by weight relative to 1 part by weight of the monomer (that is, the compound represented by the formula (VI)), and may also be used in an amount in the range of from 2 parts by weight to 50 parts by weight.

The reaction temperature is set according to the conditions. After the polymerization, the reaction product is subjected to a reprecipitation treatment as described above, and is purified.

Furthermore, in the case of using a divalent alcohol having high acidity, such as bisphenol, an interfacial polymerization method may also be used. That is, polymerization is carried out by adding a divalent alcohol to water, adding an equal amount (weight ratio) of a base to dissolve therein, and adding a divalent alcohol and an equal amount of a monomer solution thereto while vigorously stirring the system. At this time, water is used in an amount in the range of, for example, from 1 part by weight to 1,000 parts by weight relative to 1 part by weight of the divalent alcohol, and may also be used in an amount in the range of from 2 parts by weight to 500 parts by weight. As the solvent to dissolve the monomer, methylene chloride, dichloroethane, trichloroethane, toluene, chlorobenzene, 1-chloronaphthalene and the like are effective.

The reaction temperature is set according to the conditions, and in order to accelerate the reaction, it is effective to use a phase transfer catalyst such as an ammonium salt or a sulfonium salt. The phase transfer catalyst is used in an amount of, for example, in the range of from 0.1 part by weight to 10 parts by weight relative to 1 part by weight of the monomer, and may also be used in an amount in the range of from 0.2 part by weight to 5 parts by weight.

3) In case where $A^2$ is —O—$R^5$

An excess amount of a divalent alcohol represented by HO—$(Y^1$—O$)_m$—H is added to the compound represented by the formula (VI), the mixture is heated using an inorganic acid such as sulfuric acid or phosphoric acid, titanium alkoxide, an acetate or carbonate of calcium, cobalt or the like, or an oxide of zinc or lead as a catalyst, and the product is synthesized by a transesterification reaction. Meanwhile, $Y^1$ and m have the same meanings as $Y^1$ (or $Y^2$) and $m^1$ (or $m^2$) in the formula (I).

The divalent alcohol is used in an amount in the range of, for example, from 2 parts by weight to 100 parts by weight relative to 1 part by weight of the monomer (compound represented by the formula (VI)), and may also be used in an amount in the range of from 3 parts by weight to 50 parts by weight.

The catalyst is used in an amount in the range of, for example, from 1/10,000 part by weight to 1 part by weight relative to 1 part by weight of the monomer, and may also be used in an amount in the range of from 1/1,000 part by weight to 1/2 part by weight.

The reaction is carried out at a reaction temperature of from 200° C. to 300° C., and after completion of the transesterification reaction from —O—$R^5$ to —O—$(Y^1$—O$)_m$—H, the reaction is carried out, for example, under reduced pressure in order to accelerate polymerization through the detachment of HO—$(Y^1$—O$)_m$—H. Furthermore, a high-boiling point solvent such as 1-chloronaphthalene, which azeotropically boils with HO—$(Y^1$—O$)_m$—H, is used, and the reaction may be carried out while HO—$(Y^1$—O$)_m$—H is azeotropically removed at normal pressure.

Also, the polyester may also be synthesized as follows.

For each of the cases of items 1) to 3), a compound represented by the following formula (XII) is produced by adding a divalent alcohol in excess and carrying out the reaction, and then this compound is used instead of the monomer represented by the formula (VI) to react with a divalent carboxylic acid, a divalent carboxylic acid halide or the like. Thus, the polyester represented by the formula (I) is obtained.

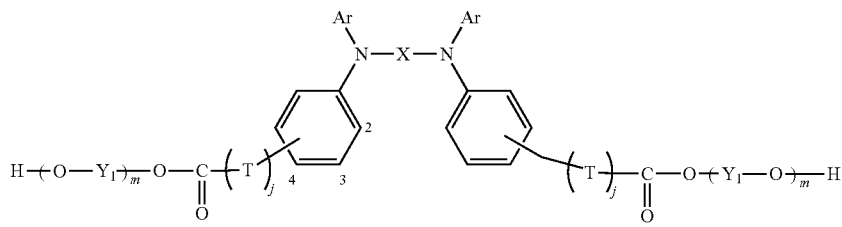

(XII)

In the formula (XII), Ar, X, T and j have the same meanings as $Ar^1$ (or $Ar^2$), X, $T_1$ (or $T_2$) and $j_1$ (or $j_2$) defined for the formula (II), respectively, and $Y^1$ and m have the same meanings as $Y^1$ (or $Y^2$) and $m^1$ (or $m^2$) defined for the formula (I), respectively.

Among the synthesis methods of the above items 1) to 3), for the charge transporting polyester according to the exemplary embodiment of the present invention, it is easy to carry out the production according to the synthesis method of 1).

Here, specific examples of the charge transporting polyester represented by the formula (I) are shown in Table 5 to Table 8, but the charge transporting polyester according to the exemplary embodiment of the present invention is not limited to these specific examples. Furthermore, in the following tables, the number indicated in the column of $A^1$ of the row of a monomer (column of "Structure of $A^1$ in formula (I)") corresponds to the structure number of the specific examples of the structure represented by the formula (II) ("structure number" of the charge transporting monomer in Table 1 to Table 4).

Hereinafter, for each of the specific examples of the charge transporting polyester designated with a compound number (polymer compound number) in the following tables, for example, a specific example designated with the number 15 is referred to as "Exemplary compound (15)". Furthermore, in each of the specific examples of the charge transporting polyester shown in the following tables, $Y^1$ and $Y^2$, $m^1$ and $m^2$ and $R^1$ and $R^2$ that are present in the formula (I) are respectively the same.

TABLE 5

| Polymer compound | Structure of A* in formula (I) | $Y^1, Y^2$ | $m^1, m^2$ | $R^1, R^2$ | p |
|---|---|---|---|---|---|
| 1 | 1 | $-(CH_2)_2-$ | 1 | H | 38 |
| 2 | 1 | $-(CH_2)_6-$ | 1 | H | 36 |
| 3 | 2 | —⟨phenyl⟩—CH$_2$—⟨phenyl⟩— | 1 | H | 48 |
| 4 | 3 | $-(CH_2)_2-$ | 1 | H | 56 |
| 5 | 4 | $-(CH_2)_2-$ | 1 | H | 47 |
| 6 | 4 | —⟨cyclohexyl⟩—CH$_2$—⟨cyclohexyl⟩— | 1 | H | 37 |
| 7 | 6 | $-(CH_2)_2-$ | 1 | H | 48 |
| 8 | 8 | —CH$_2$—⟨phenyl⟩—CH$_2$— | 1 | H | 42 |
| 9 | 9 | $-(CH_2)_2-$ | 1 | H | 34 |
| 10 | 11 | $-(CH_2)_2-$ | 1 | H | 58 |

TABLE 6

| Polymer compound | Structure of A* in formula (I) | $Y^1, Y^2$ | $m^1, m^2$ | $R^1, R^2$ | p |
|---|---|---|---|---|---|
| 11 | 11 | —⟨cyclohexyl⟩— | 1 | H | 68 |
| 12 | 11 | —⟨phenyl(meta)⟩— | 1 | H | 71 |
| 13 | 12 | $-(CH_2)_2-$ | 1 | H | 72 |
| 14 | 13 | $-(CH_2)_2-$ | 1 | H | 46 |
| 15 | 14 | $-(CH_2)_2-$ | 1 | H | 62 |
| 16 | 14 | —⟨cyclohexyl⟩— | 1 | H | 48 |
| 17 | 15 | $-(CH_2)_2-$ | 1 | H | 45 |

TABLE 6-continued

| Polymer compound | Structure of A* in formula (I) | $Y^1, Y^2$ | $m^1, m^2$ | $R^1, R^2$ | p |
|---|---|---|---|---|---|
| 18 | 16 | $-\!\!+\!CH_2\!\!\rightarrow_{\!\!2}$ | 1 | H | 48 |
| 19 | 17 | $-\!\!+\!CH_2\!\!\rightarrow_{\!\!2}$ | 1 | H | 63 |
| 20 | 18 | 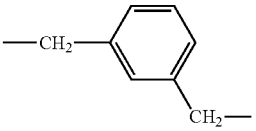 | 1 | H | 53 |

TABLE 7

| Polymer compound | Structure of A* in formula (I) | $Y^1, Y^2$ | $m^1, m^2$ | $R^1, R^2$ | p |
|---|---|---|---|---|---|
| 21 | 18 | $-\!\!+\!CH_2\!\!\rightarrow_{\!\!2}$ | 1 | H | 63 |
| 22 | 19 | $-\!\!+\!CH_2\!\!\rightarrow_{\!\!2}$ | 1 | H | 51 |
| 23 | 20 | $-\!\!+\!CH_2\!\!\rightarrow_{\!\!2}$ | 1 | H | 53 |
| 24 | 21 | $-\!\!+\!CH_2\!\!\rightarrow_{\!\!2}$ | 1 | H | 59 |
| 25 | 22 | $-\!\!+\!CH_2\!\!\rightarrow_{\!\!2}$ | 1 | H | 78 |
| 26 | 23 | $-\!\!+\!CH_2\!\!\rightarrow_{\!\!2}$ | 1 | H | 62 |
| 27 | 24 | $-\!\!+\!CH_2\!\!\rightarrow_{\!\!2}$ | 1 | H | 42 |
| 28 | 25 | $-\!\!+\!CH_2\!\!\rightarrow_{\!\!6}$ | 1 | H | 48 |
| 29 | 26 | $-\!\!+\!CH_2\!\!\rightarrow_{\!\!2}$ | 1 | H | 65 |
| 30 | 27 | $-\!\!+\!CH_2\!\!\rightarrow_{\!\!2}$ | 1 | H | 65 |

TABLE 8

| Polymer compound | Structure of A* in formula (I) | $Y^1, Y^2$ | $m^1, m^2$ | $R^1, R^2$ | p |
|---|---|---|---|---|---|
| 31 | 28 | $-\!\!+\!CH_2\!\!\rightarrow_{\!\!2}$ | 1 | H | 65 |
| 32 | 29 | $-\!\!+\!CH_2\!\!\rightarrow_{\!\!2}$ | 1 | H | 65 |
| 33 | 31 | $-\!\!+\!CH_2\!\!\rightarrow_{\!\!2}$ | 1 | H | 65 |
| 34 | 32 | $-\!\!+\!CH_2\!\!\rightarrow_{\!\!2}$ | 1 | H | 65 |

Next, the configuration of the organic electroluminescent element of the exemplary embodiment of the present invention will be described in detail.

The organic electroluminescent element of the exemplary embodiment of the present invention includes a pair of electrodes, with at least one of the electrodes being transparent or semi-transparent, and organic compound layer interposed between those electrodes, and the layer configuration is not particularly limited as long as at the organic compound layer contains one of the charge transporting polyesters described above.

In the organic electroluminescent element of the exemplary embodiment of the present invention, when the organic compound layer is one layer, the organic compound layer means a light emitting layer having charge transport capability, and the light emitting layer contains the charge transporting polyester described above. On the other hand, when the organic compound layer contains plural layers (that is, in the case of a functionally separated type with the respective layers having different functions), at least one of the layers becomes a light emitting layer, and this light emitting layer may be a light emitting layer having charge transport capability. In this case, specific examples of the layer configuration including the light emitting layer or a light emitting layer having charge transport capability, and other layers include the following items (1) to (3).

(1) Layer configuration composed of a light emitting layer and at least any one of an electron transport layer and an electron injection layer.

(2) Layer configuration composed of at least any one of a hole transport layer and a hole injection layer, a light emitting layer, and at least any one of an electron transport layer and an electron injection layer.

(3) Layer configuration composed of at least any one of a hole transport layer and a hole injection layer, and a light emitting layer.

The light emitting layer, and the layer other than a light emitting layer, which has charge transport capability, of these layer configurations (1) to (3) have a function as a charge transport layer or a charge injection layer.

Meanwhile, it is desirable that all of these layer configurations of (1) to (3) contain the charge transporting polyester in any one layer.

Furthermore, in the organic electroluminescent element of the exemplary embodiment, the light emitting layer, the hole transport layer, the hole injection layer, the electron transport layer and the electron injection layer may further contain a charge transporting compound (a hole transporting material or an electron transporting material) other than the charge transporting polyester. The details of the charge transporting compound will be described below.

Hereinafter, the organic electroluminescent element of the exemplary embodiment of the present invention will be described in more detail, but the organic electroluminescent element is not intended to be limited to these.

Figure 2:
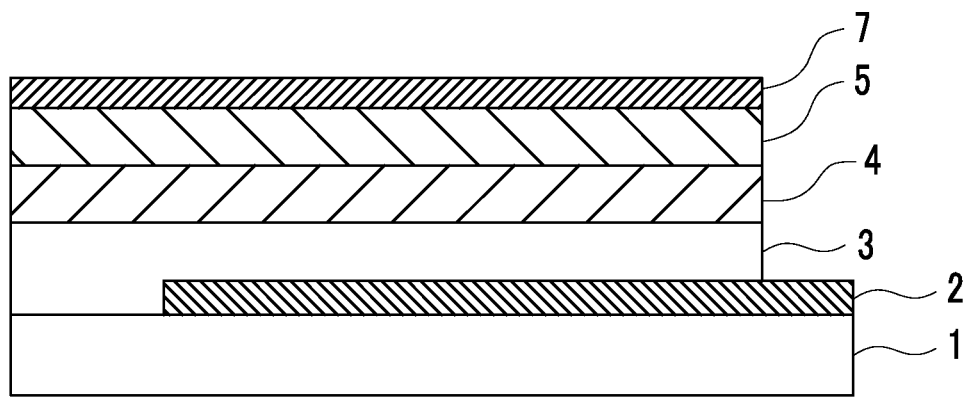
FIG. 2 is a schematic configuration diagram showing the layer configuration of an organic electroluminescent element according to another exemplary embodiment of the present invention.
Figure 3:
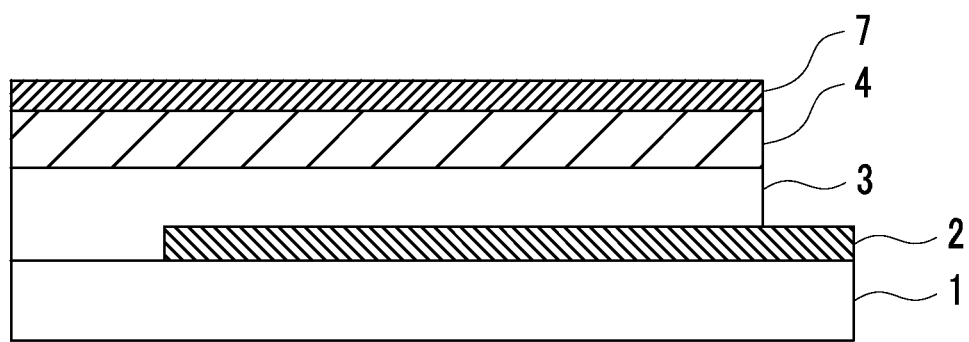
FIG. 3 is a schematic configuration diagram showing the layer configuration of an organic electroluminescent element according to another exemplary embodiment of the present invention.
Figure 4:
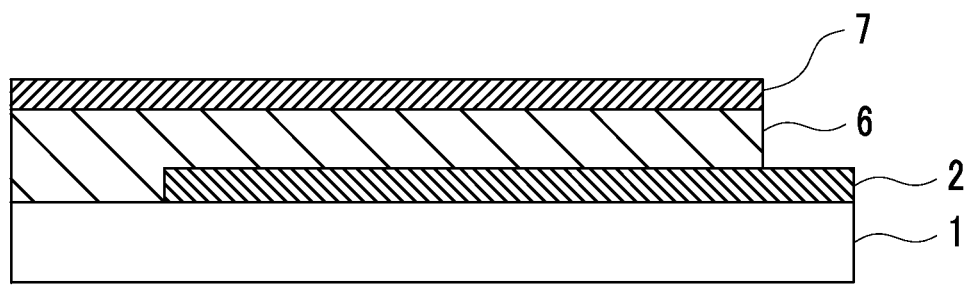
FIG. 4 is a schematic configuration diagram showing the layer configuration of an organic electroluminescent element according to another exemplary embodiment of the present invention.

FIG. 1 to FIG. 4 are schematic cross-sectional diagrams for explaining the layer configurations of the organic electroluminescent element of the exemplary embodiment of the present invention. FIG. 1, FIG. 2 and FIG. 3 show examples of the case where there are plural organic compound layers, and FIG. 4 shows an example of the case where there is one organic compound layer. Meanwhile, in FIG. 1 to FIG. 4, members having the same function will be described under the same reference numeral.

The organic electroluminescent element shown in FIG. 1 has a configuration in which on a transparent insulator substrate 1, a transparent electrode 2, a light emitting layer 4, at least one layer 5 of an electron transport layer and an electron injection layer, and a back surface electrode 7 are laminated in sequence, and this corresponds to the layer configuration (1). However, when the layer designated with Reference Numeral 5 is composed of an electron transport layer and an electron injection layer, the electron transport layer, the electron injection layer and the back surface electrode 7 are laminated in this order on the back surface electrode 7 side of the light emitting layer 4.

The organic electroluminescent element shown in FIG. 2 has a configuration in which on a transparent insulator substrate 1, a transparent electrode 2, at least one layer 3 of a hole transport layer and a hole injection layer, a light emitting layer 4, at least one layer 5 of an electron transport layer and an electron injection layer, and a back surface electrode 7 are laminated in sequence, and this corresponds to the layer configuration (2). However, when the layer designated with Reference Numeral 3 is constituted of a hole transport layer and a hole injection layer, the hole injection layer, the hole transport layer and the light emitting layer 4 are laminated in this order on the back surface electrode 7 side of the transparent electrode 2. Furthermore, when the layer designated with Reference Numeral 5 is composed of an electron transport layer and an electron injection layer, the electron transport layer, the electron injection layer, and the back surface electrode 7 are laminated in this order on the back surface electrode 7 of the light emitting layer 4.

The organic electroluminescent element shown in FIG. 3 has a configuration in which on a transparent insulator substrate 1, a transparent electrode 2, at least one layer 3 of a hole transport layer and a hole injection layer, a light emitting layer 4 and a back surface electrode 7 are laminated in sequence, and this corresponds to the layer configuration (3). However, when the layer designated with Reference Numeral 3 is composed of a hole transport layer and a hole injection layer, the hole injection layer, the hole transport layer and the light emitting layer 4 are laminated in this order on the back surface electrode 7 side of the transparent electrode 2.

The organic electroluminescent element shown in FIG. 4 has a configuration in which on a transparent insulator substrate 1, a transparent electrode 2, a light emitting layer 6 having charge transport capability, and a back surface electrode 7 are laminated in sequence.

Furthermore, when the organic electroluminescent element has a top emission structure or is made as a transmissive type using transparent electrodes for both the negative electrode and the positive electrode, a structure in which the layer configurations of FIG. 1 to FIG. 4 are stacked in plural stages is also realized.

Hereinafter, each of the configurations will be described in detail.

The charge transporting polyester according to the exemplary embodiment of the present invention is also imparted with any of hole transport capability and electron transport capability through the function of the organic compound layer in which the polyester is included.

For example, in the case of the layer configuration of the organic electroluminescent element shown in FIG. 1, the charge transporting polyester may be included in any one of the light emitting layer 4 and at least one layer 5 of the electron transport layer and the electron injection layer, and acts as all of the light emitting layer 4 and the at least one layer 5 of the electron transport layer and the electron injection layer. Furthermore, in the case of the layer configuration of the organic electroluminescent element shown in FIG. 2, the charge transporting polyester may be included in any one of the at least one layer 3 of the hole transport layer and the hole injection layer, the light emitting layer 4 and the at least one layer 5 of the electron transport layer and the electron injection layer, and acts as all of the at least one layer 3 of the hole transport layer and the hole injection layer, the light emitting layer 4, and the at least one layer 5 of the electron transport layer and the electron injection layer. Furthermore, in the case of the layer configuration of the organic electroluminescent element shown in FIG. 3, the charge transporting polyester may be included in any one of the at least one layer 3 of the hole transport layer and the hole injection layer, and the light emitting layer 4, and acts as all of the at least one layer 3 of the hole transport layer and the hole injection layer, and the light emitting layer 4. Furthermore, in the case of the layer configuration of the organic electroluminescent element shown in FIG. 4, the charge transporting polyester is included in the light emitting layer 6 having charge transport capability, and acts as the light emitting layer 6 having charge transport capability.

In the case of the layer configurations of the organic electroluminescent element shown in FIG. 1 to FIG. 4, a transparent substrate may be used to extract emitted light for the transparent insulator substrate 1, and a glass plate, a plastic film and the like may be used, but the substrate is not limited to these. The term "transparent" means that the transmittance of light in the visible region is 10% or higher, and the transmittance may be 75% or higher. Hereinafter, the transmittance is equivalent to this value.

Furthermore, the transparent electrode 2 is transparent or semi-transparent so that emitted light is extracted at a level equivalent to that of the transparent insulator substrate, and in order to carry out injection of holes, an electrode having a large work function may be used. An example may be an electrode having a work function of 4 eV or higher. The term "semi-transparent" means that the transmittance of light in the visible region is 70% or higher, and the transmittance may be 80% or higher. Hereinafter, the transmittance is equivalent to this value.

As specific examples, oxide films of indium tin oxide (ITO), tin oxide (NESA), indium oxide, zinc oxide and the like, and deposited or sputtered gold, platinum, palladium and the like are used, but the electrode is not limited to these. The sheet resistance of the electrode is such that a lower value is more desirable, and the sheet resistance may be several hundred $\Omega/\square$ or less, or may also be $100\Omega/\square$ or less. The transparent electrode may have a transmittance of light in the visible region of 10% or higher in equivalence to the transparent insulator substrate, and the transmittance may also be 75% or higher.

In the case of the layer configurations of the organic electroluminescent element shown in FIG. 1 to FIG. 3, the electron transport layer or the hole transport layer may be formed from the charge transporting polyester alone, to which a function (electron transport capability or hole transport capability) is imparted according to the purpose. However, for example, in order to regulate the hole mobility, the layer may also be formed by mixing and dispersing a hole transporting material other than the charge transporting polyester in an amount in the range of 0.1% by weight to 50% by weight relative to the total amount of the materials constituting the layer.

Examples of the hole transporting material include a tetraphenylenediamine derivative, a triphenylamine derivative, a carbazole derivative, a stilbene derivative, a spirofluorene derivative, an arylhydrazone derivative, and a porphyrin compound, and among these, examples having good compatibility with the charge transporting polyester include a tetraphenylenediamine derivative, a spirofluorene derivative, and a triphenylamine derivative.

In the case of regulating the electron mobility, the layer may be formed by mixing and dispersing the electron transporting material in an amount of from 0.1% by weight to 50% by weight relative to the total amount of the material constituting the layer.

Examples of the electron transporting material include an oxadiazole derivative, a nitro-substituted fluorenone derivative, a diphenoquinone derivative, a thiopyran dioxide derivative, a silol derivative, a chelate type organometallic complex, a polynuclear or condensed aromatic ring compound, a perylene derivative, a triazole derivative, and a fluorenylidenemethane derivative.

Furthermore, when regulation is required in both the hole mobility and the electron mobility, both the hole transporting material and the electron transporting material may be incorporated together into the charge transporting polyester.

Furthermore, for the purpose of an improvement of the film-forming properties, prevention of pinholes, and the like, an appropriate resin (polymer) and additives may also be added. Specific examples of the resin that may be used include electrically conductive resins such as a polycarbonate resin, a polyester resin, a methacrylic resin, an acrylic resin, a polyvinyl chloride resin, a cellulose resin, a urethane resin, an epoxy resin, a polystyrene resin, a polyvinyl acetate resin, a styrene-butadiene copolymer, a vinylidene chloride-acrylonitrile copolymer, a vinyl chloride-vinyl acetate-maleic anhydride copolymer, a silicone resin, a poly-N-vinylcarbazole resin, a polysilane resin, polythiophene, and polypyrrole. Furthermore, as the additives, known antioxidants, ultraviolet absorbents, plasticizers and the like may be used.

Furthermore, in the case of enhancing charge injectability, a hole injection layer or an electron injection layer may be used, and examples of a hole injecting material that may be used include a triphenylamine derivative, a phenylenediamine derivative, a phthalocyanine derivative, an indanthrene derivative, and a polyalkylenedioxythiophene derivative. Furthermore, a Lewis acid, sulfonic acid and the like may be incorporated into these materials. Examples of an electron injecting material that may be used include metals such as lithium (Li), calcium (Ca), barium (Ba), strontium (Sr), silver (Ag) and gold (Au); metal fluorides such as LiF and MgF; and metal oxides such as MgO, $Al_2O_3$, and LiO.

Furthermore, when the charge transporting polyester is used for a function other than the light emitting function, a luminescent compound is used as the light emitting material. As the light emitting material, a compound that exhibits high light emission quantum efficiency in the solid state is used. The light emitting material may be any of a low molecular weight compound and a polymeric compound, and specific examples of an organic low molecular weight compound include a chelate type organometallic complex, a polynuclear or condensed aromatic ring compound, a perylene derivative, a coumarin derivative, a styrylarylene derivative, a silol derivative, an oxazole derivative, an oxabenzothiazole derivative, an oxathiazole derivative, and an oxadiazole derivative, while specific examples of a polymeric compound that may be used include a polyparaphenylene derivative, a polyparaphenylenevinylene derivative, a polythiophene derivative, and a polyacetylene derivative. Specific examples include the following compounds (XV-1) to (XV-17), but the examples are not limited to these.

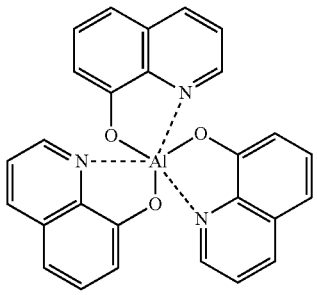

(XV-1)

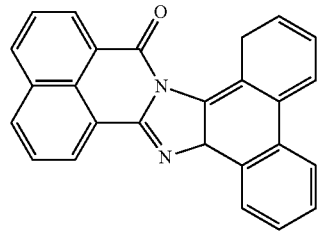

(XV-2)

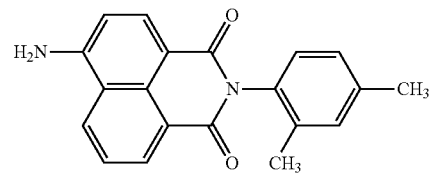

(XV-3)

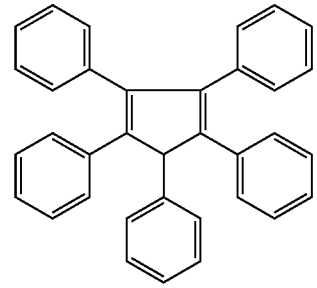

(XV-4)

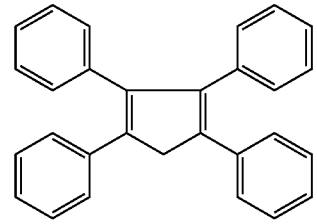

(XV-5)

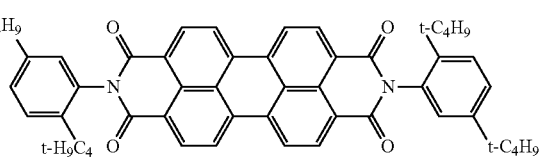

(XV-6)

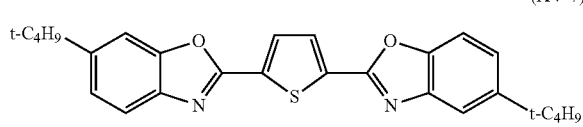

(XV-7)

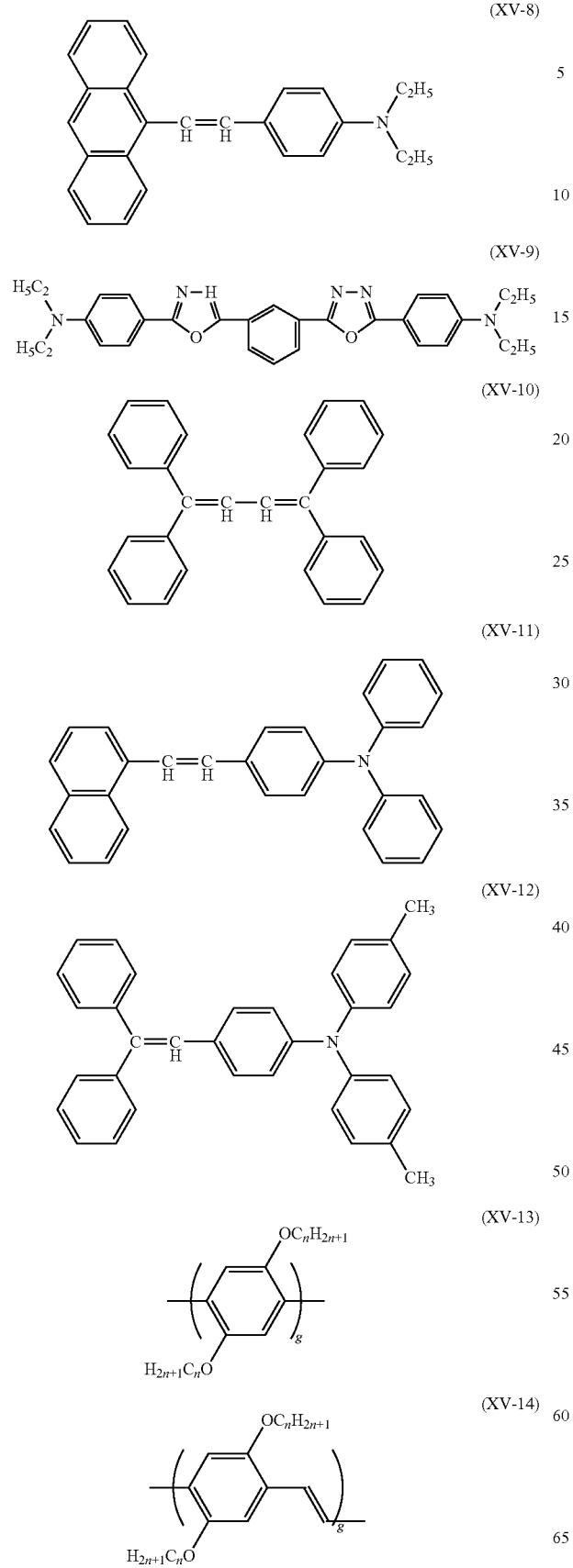
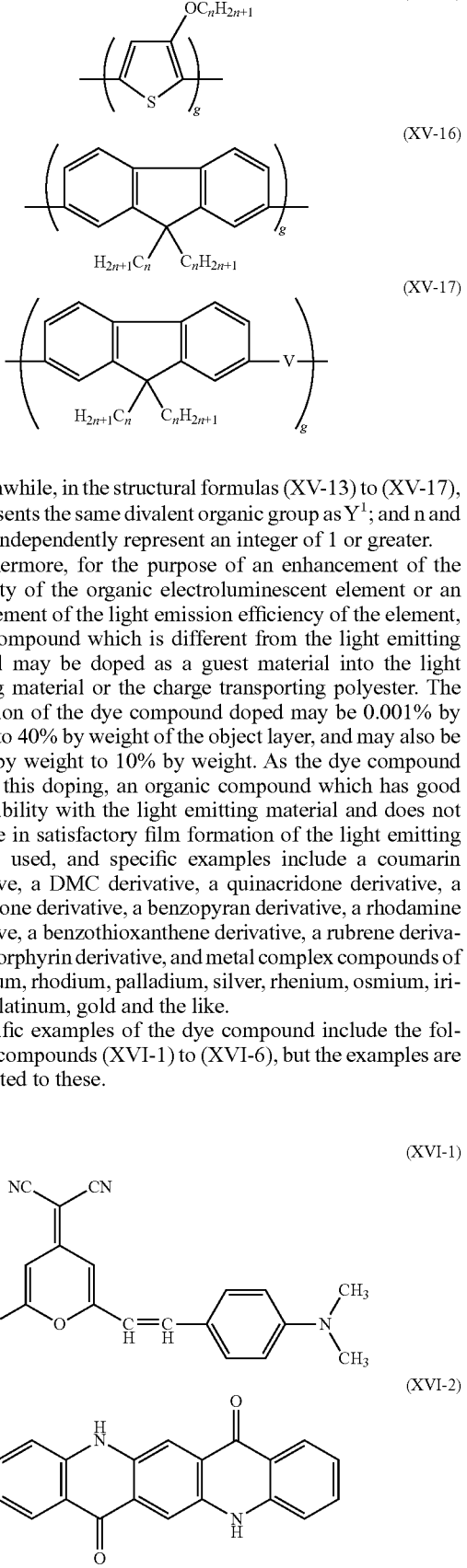

Meanwhile, in the structural formulas (XV-13) to (XV-17), V represents the same divalent organic group as $Y^1$; and n and g each independently represent an integer of 1 or greater.

Furthermore, for the purpose of an enhancement of the durability of the organic electroluminescent element or an enhancement of the light emission efficiency of the element, a dye compound which is different from the light emitting material may be doped as a guest material into the light emitting material or the charge transporting polyester. The proportion of the dye compound doped may be 0.001% by weight to 40% by weight of the object layer, and may also be 0.01% by weight to 10% by weight. As the dye compound used in this doping, an organic compound which has good compatibility with the light emitting material and does not interfere in satisfactory film formation of the light emitting layer is used, and specific examples include a coumarin derivative, a DMC derivative, a quinacridone derivative, a perimidone derivative, a benzopyran derivative, a rhodamine derivative, a benzothioxanthene derivative, a rubrene derivative, a porphyrin derivative, and metal complex compounds of ruthenium, rhodium, palladium, silver, rhenium, osmium, iridium, platinum, gold and the like.

Specific examples of the dye compound include the following compounds (XVI-1) to (XVI-6), but the examples are not limited to these.

(XVI-3)

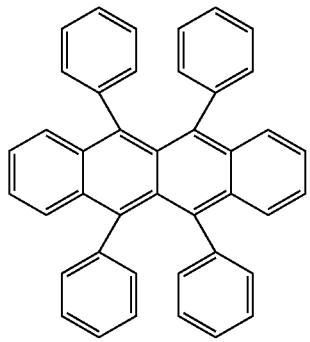

(XVI-4)

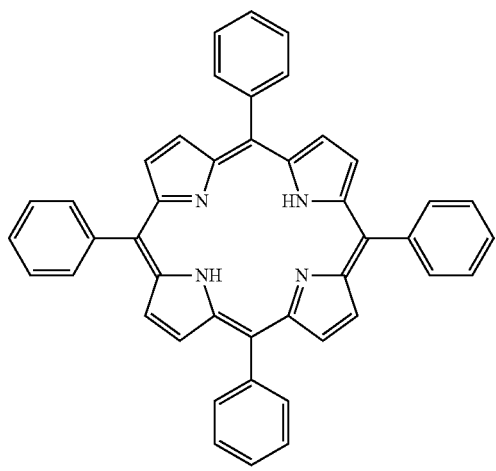

(XVI-5)

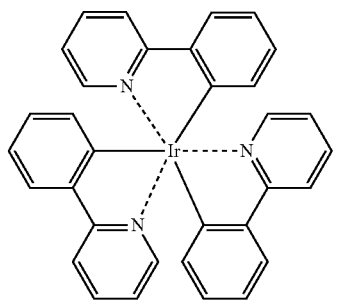

(XVI-6)

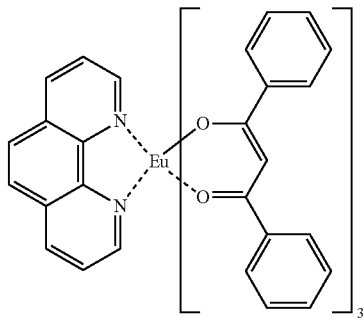

Furthermore, the light emitting layer 4 may be formed of the light emitting material alone, but for the purpose of further improving the electrical characteristics and light emitting characteristics, the light emitting layer may be formed by mixing and dispersing the charge transporting polyester into the light emitting material in an amount in the range of from 1% by weight to 50% by weight. Alternatively, the light emitting layer may be formed by mixing and dispersing a charge transporting material other than the charge transporting polyester into the light emitting material in an amount in the range of from 1% by weight to 50% by weight. Furthermore, when the charge transporting polyester also has light emitting characteristics, the charge transporting material may also be used as a light emitting material, and in that case, for the purpose of further improving the electrical characteristics and light emitting characteristics, the light emitting layer may be formed by mixing and dispersing a charge transporting material other than the charge transporting polyester in an amount in the range of from 1% by weight to 50% by weight.

In the case of the layer configuration of the organic electroluminescent element shown in FIG. 4, the light emitting layer 6 having charge transport capability is an organic compound layer in which a light emitting material (specifically, for example, at least one selected from the light emitting materials (XV-1) to (XV-17)) is dispersed in the charge transporting polyester imparted with a function (hole transport capability or electron transport capability) according to the purpose, in an amount of 50% by weight or less. However, in order to adjust the balance between the holes and electrons injected into the organic electroluminescent element, a charge transporting material other than the charge transporting polyester may be dispersed in an amount of from 10% by weight to 50% by weight.

As the charge transporting material, in the case of regulating the electron mobility, examples of the electron transporting material include an oxadiazole derivative, a nitro-substituted fluorenone derivative, a diphenoquinone derivative, a thiopyran dioxide derivative, and a fluorenylidenemethane derivative.

In the case of the layer configurations of the organic electroluminescent element shown in FIG. 1 to FIG. 4, the back surface electrode 7 uses a metal, a metal oxide, a metal fluoride or the like, which all have a small work function in order to be vacuum deposited and perform electron injection. Examples of the metal include magnesium, aluminum, gold, silver, indium, lithium, calcium, and alloys thereof. Examples of the metal oxide include lithium oxide, magnesium oxide, aluminum oxide, indium tin oxide, tin oxide, indium oxide, zinc oxide, and indium zinc oxide. Furthermore, examples of the metal fluoride include lithium fluoride, magnesium fluoride, strontium fluoride, calcium fluoride, and aluminum fluoride.

Furthermore, a protective layer may be further provided on the back surface electrode 7 in order to prevent deterioration of the element due to moisture or oxygen. Specific examples of the material for the protective layer include metals such as In, Sn, Pb, Au, Cu, Ag and Al; metal oxides such as MgO, $SiO_2$, and $TiO_2$; and resins such as a polyethylene resin, a polyurea resin, and a polyimide resin. In the formation of the protective layer, a vacuum deposition method, a sputtering method, a plasma polymerization method, a CVD method, or a coating method is applied.

The organic electroluminescent elements shown in these FIG. 1 to FIG. 4 are produced by first sequentially forming individual layers in accordance with each of the layer configurations of the organic electroluminescent element on a transparent electrode 2. The at least one layer 3 of the hole transport layer and the hole injection layer, the light emitting layer 4, the at least one layer 5 of the electron transport layer and the electron injection layer, and the light emitting layer 6 having charge transport capability are formed on a transparent electrode by a vacuum deposition method, or by dissolving or dispersing the respective materials in an appropriate organic solvent, and using the resulting coating liquid by a spin coating method, a casting method, a dipping method, an inkjet method or the like.

The thicknesses of the at least one layer 3 of the hole transport layer and the hole injection layer, the light emitting layer 4, the at least one layer 5 of the electron transport layer and the electron injection layer, and the light emitting layer 6 having charge transport capability may be respectively 10 µm or less, and particularly in the range of from 0.001 µm to 5 µm. The dispersed state of the respective materials (the above-described non-conjugated polymer, light emitting material, and the like) may be a molecular dispersed state or may be a particulate state such as microcrystals. In the case of a film-forming method using a coating liquid, in order to obtain a molecular dispersed state, it is necessary to select the dispersion solvent in consideration of the dispersibility and solubility of the respective materials. In order to disperse the materials in a particulate form, a ball mill, a sand mill, a paint shaker, an attriter, a homogenizer, an ultrasonic method or the like is used.

Finally, in the case of the organic electroluminescent elements shown in FIG. 1 and FIG. 2, the organic electroluminescent element of the exemplary embodiment of the present invention may be obtained by forming the back surface electrode 7 on the at least one layer 5 of the electron transport layer and the electron injection layer by a vacuum deposition method, a sputtering method or the like. Furthermore, in the case of the organic electroluminescent element shown in FIG. 3, the organic electroluminescent element of the exemplary embodiment of the present invention may be obtained by forming the back surface electrode 7 on the light emitting layer 4, and in the case of the organic electroluminescent element shown in FIG. 4, on the light emitting layer 6 having charge transport capability, by a vacuum deposition method, a sputtering method or the like.

<Display>

The display of the exemplary embodiment of the present invention is characterized in that the organic electroluminescent element of the exemplary embodiment of the present invention is arranged in at least one of a matrix form and a segment form. In the case of arranging the organic electroluminescent element in a matrix form in the exemplary embodiment, only the electrodes may be arranged in the matrix form, or both the electrodes and the organic compound layer may be arranged in the matrix form. Furthermore, in the case of arranging the organic electroluminescent element in a segment form in the exemplary embodiment, only the electrodes may be arranged in the segment form, or both the electrodes and the organic compound layer may be arranged in the segment form.

The organic compound layer in the matrix form or the segment form is easily formed by, for example, using the inkjet method described above.

As the driving apparatus for a display constituted of the organic electroluminescent element arranged in a matrix form and the organic electroluminescent element arranged in the segment form, and the method for driving the driving apparatus, the conventionally known ones are used.

EXAMPLES

Hereinafter, the present invention will be described more specifically as Examples. However, the present invention is not intended to be limited to these Examples.

<Synthesis of Charge Transporting Polyester>

Synthesis Example 1

Synthesis of Exemplary Compound (15)

In a nitrogen atmosphere, 1.6 M n-butyllithium (78.0 ml) is poured into anhydrous tetrahydrofuran (100 ml), and 5-bromo-2-chloropyridine (20.0 g) dissolved in anhydrous THf (80 ml) is added dropwise thereto. Subsequently, the mixture is stirred for 3.5 hours at −78° C. 1.6 M n-butyl-lithium (19.6 ml) is added thereto, and the mixture is stirred for 1 hour at −78° C. Tri-n-butyl borate (28.8 g) is added thereto, and the reaction mixture is stirred for 2 hours at −78° C., and then is stirred overnight at room temperature (25° C.).

After completion of the reaction, the reaction solution is transferred into a separatory funnel to partition the reaction solution into an organic layer and an aqueous layer. An appropriate amount of sodium hydroxide (10%) is added to the aqueous layer to adjust the pH to 8, and the aqueous layer is extracted 3 times with diethyl ether. 2,2-Dimethyl-1,3-propanediol (10.4 g, 104.0 mmol) and sodium sulfate are added to the organic layer to dry the organic layer. The organic layer is suction filtered, and the filtrate is distilled off under reduced pressure. Thus, a crude product is obtained. This is purified by column chromatography (hexane/ethyl acetate=1/1), and thus, 2-chloro-5-(5,5-dimethyl-1,3,2-dioxaborinan-2-yl)pyridine (13.2 g) is obtained.

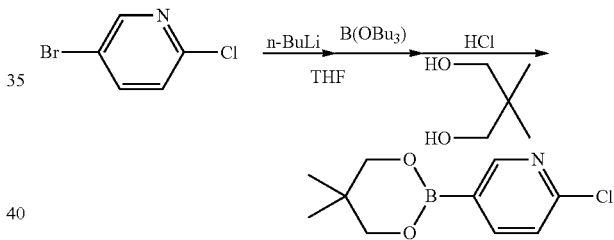

A liquid mixture of 1-bromo-4-iodobenzene (18.6 g), DAA-1 (17.5 g), copper(II) sulfate pentahydrate (1.0 g), potassium carbonate (4.6 g), and tridecane (10 ml) is stirred for 7 hours at 210° C.

After completion of the reaction, potassium hydroxide (15.6 g) dissolved in ethylene glycol (300 ml) is added thereto, and the resulting mixture is heated to reflux for 3.5 hours under a nitrogen gas stream, and then is cooled to room temperature (25° C.). The reaction liquid is poured into 1 L of distilled water and neutralized with hydrochloric acid, and crystals are precipitated out. The crystals are filtered by suction filtration, and washed with water, and then the crystals are transferred to a 1-L flask. Toluene (500 ml) is added to this, and the mixture is heated to reflux. Water is removed by azeotropically boiling the reaction mixture, subsequently a methanol (300 ml) solution of concentrated sulfuric acid (1.5 ml) is added thereto, and the resulting mixture is heated to reflux for 5 hours under a nitrogen gas stream.

The mixture is cooled to room temperature (25° C.), toluene is added thereto, and the mixture is filtered through Celite. The filtrate is washed with pure water, and the organic layer is extracted. A product obtained by distilling off the organic solvent is separated by silica gel column chromatography (hexane 4:toluene 1), and thus, TAA-1 (15.7 g) is obtained.

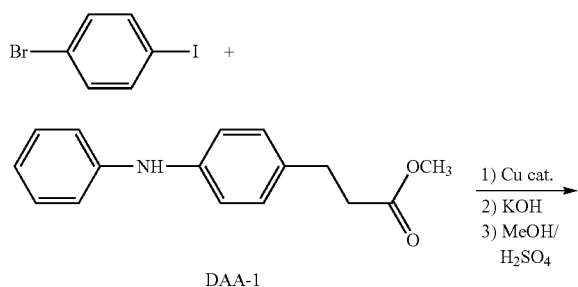

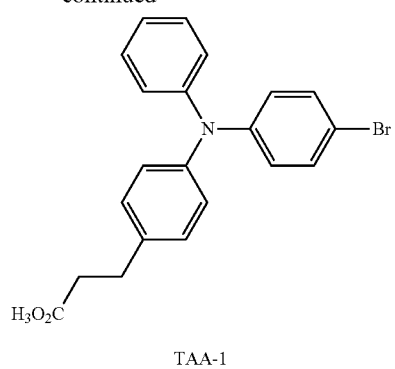

In a nitrogen atmosphere, TAA-1 (13.8 g), tetrakis(triphenylphosphine)palladium(0) (1.1 g), ethanol (30 ml), a 2 M sodium carbonate solution (30 ml) and 2-chloro-5-(5,5-dimethyl-1,3,2-dioxaborinan-2-yl)pyridine (11.4 g) are dissolved in toluene, and the solution is heated to reflux while stirred for 6 hours.

After completion of the reaction, the reaction solution is transferred into a separatory funnel, water and toluene are added thereto, and liquid-liquid partition is carried out. The organic layer is washed with saturated brine, and then is dried over sodium sulfate. The solvent is distilled off under reduced pressure, and a crude product is obtained. This is purified by column chromatography (hexane/ethyl acetate=5/1), and thus TAA-2 (4.1 g) is obtained.

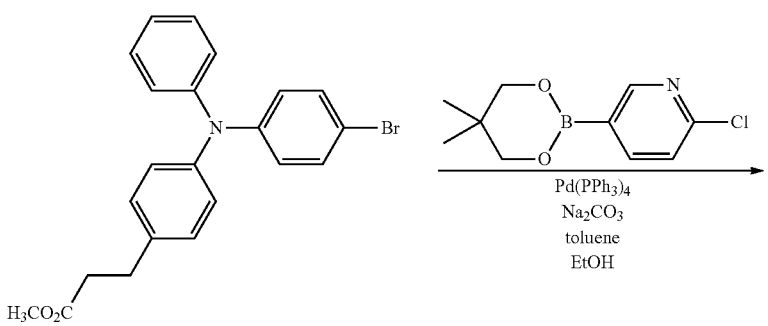

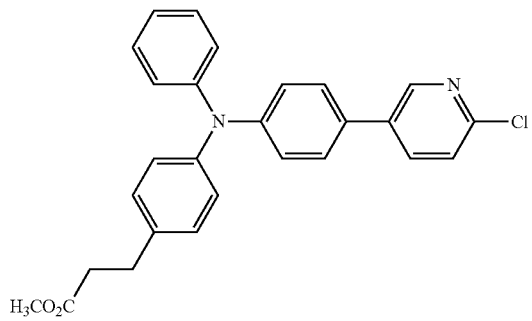

Furthermore, in a nitrogen atmosphere, triphenylphosphine (9.5 g) and nickel (II) chloride (1.5 g) are dissolved in anhydrous DMF (40 ml), and the solution is heated and stirred up to 50° C. Zinc (0.6 g) and TAA-2 (3.9 g) are added thereto, and the resulting mixture is heated and stirred for 4 hours at 50° C. After completion of the reaction, the reaction solution is transferred into a separatory funnel, water and chloroform are added thereto, and liquid-liquid partition is carried out. Furthermore, the aqueous layer is extracted with chloroform, and the organic layer is suction filtered. The filtrate is dried over sodium sulfate. The solvent is distilled off under reduced pressure, water is added to the residue, and the mixture is suction filtered. Thus, a crude product is obtained. This is washed with an aqueous EDTA solution, and then the product is purified by column chromatography (hexane/ethyl acetate=2/1). Thus, 1.5 g of a monomer compound (14) is obtained.

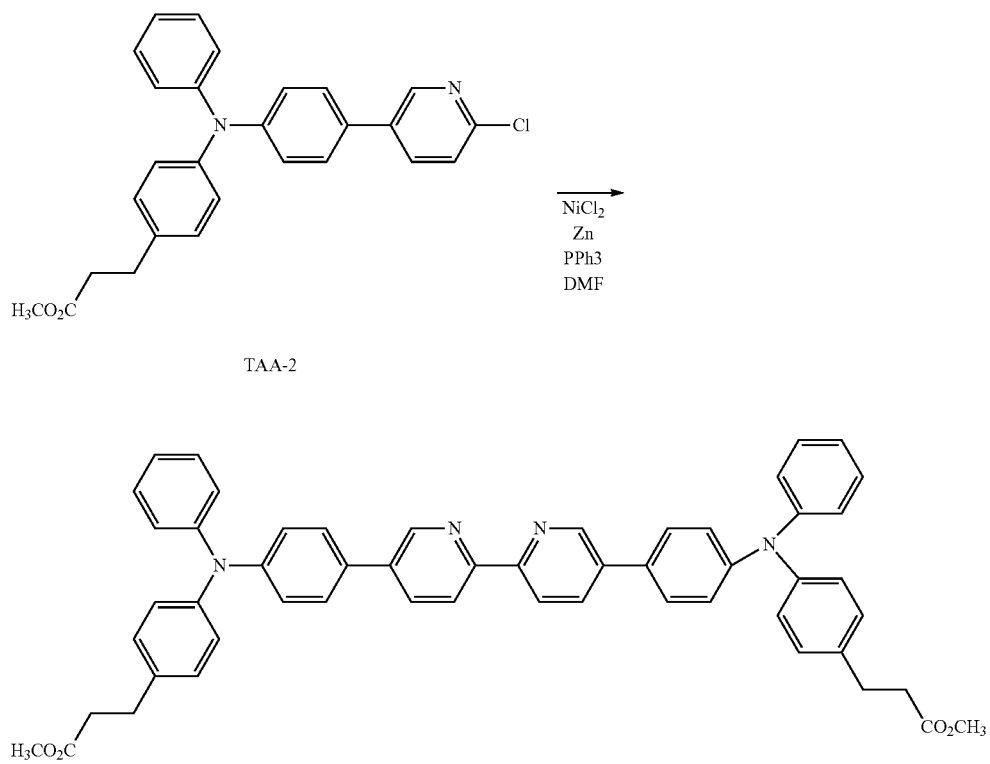

TAA-2

1.0 g of the monomer compound (14) thus obtained is used, and ethylene glycol (10 ml) and tetrabutoxytitanium (0.02 g) are introduced into a 50-ml three-necked pear-shaped flask, and the mixture is heated and stirred at 200° C. for 5 hours in a nitrogen atmosphere. It is confirmed by TLC that the raw material monomer compound (14) has reacted and disappeared, and then the reaction mixture is heated to 210° C., while ethylene glycol is distilled off at a reduced pressure of 50 Pa. The reaction is continued for 6 hours.

Thereafter, the reaction mixture is cooled to room temperature (25° C.), and is dissolved in tetrahydrofuran (50 ml). Any insoluble matter is filtered through a 0.5-μm polytetrafluoroethylene (PTFE) filter, and the filtrate is distilled off under reduced pressure. Subsequently, the residue is dissolved in monochlorobenzene (300 ml), and the solution is washed sequentially with 1 N HCl (300 ml) and water (500 ml×3). The monochlorobenzene solution is distilled off under reduced pressure to a final volume of 30 ml, and the concentrated solution is added dropwise to. 800 ml of ethyl acetate/methanol=1/3 to reprecipitate the polymer.

The polymer thus obtained is filtered, washed with methanol, and then dried in a vacuum at 60° C. for 16 hours. Thus, 0.7 g of a polymer [Exemplary Compound (15)] is obtained.

The molecular weight of this polymer is measured by gel permeation chromatography (GPC) (manufactured by Tosoh Corp., HLC-8120 GPC), and the weight average molecular weight is Mw=$3.7 \times 10^4$ (relative to styrene standards), Mw/Mn=2.22, and the degree of polymerization p determined from the molecular weight of the raw material (monomer compound) is about 45.

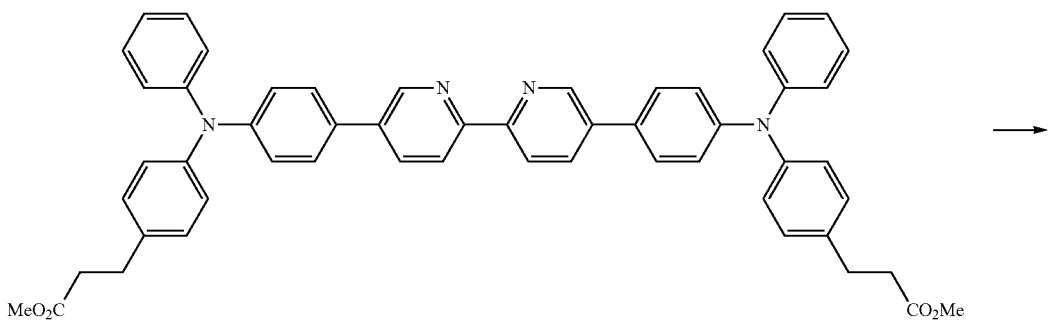

Monomer Compound (14)

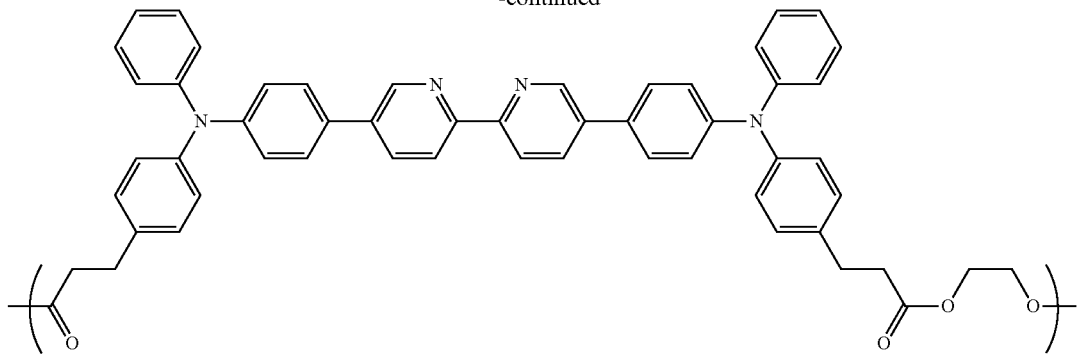

Exemplary Compound (15)

Synthesis Example 2

Synthesis of Exemplary Compound (17)

4-Methylacetanilide (21.0 g), methyl 4-iodophenylpropionate (64.4 g), potassium carbonate (38.3 g), copper sulfate pentahydrate (2.3 g), and n-tridecane (50 ml) are introduced into a 500-ml three-necked flask, and the mixture is heated and stirred for 20 hours at 230° C. under a nitrogen gas stream.

After completion of the reaction, potassium hydroxide (15.6 g) dissolved in ethylene glycol (300 ml) is added thereto, and the resulting mixture is heated to reflux for 3.5 hours under a nitrogen gas stream, and then is cooled to room temperature (25° C.). The reaction liquid is poured into 1 L of distilled water and neutralized with hydrochloric acid, and crystals are precipitated out. The crystals are filtered by suction filtration and washed with water, and then the crystals are transferred to a 1-L flask. Toluene (500 ml) is added to this, and the mixture is heated to reflux. Water is removed by azeotropically boiling the reaction mixture, subsequently a methanol (300 ml) solution of concentrated sulfuric acid (1.5 ml) is added thereto, and the resulting mixture is heated to reflux for 5 hours under a nitrogen gas stream.

After the reaction, the reaction mixture is extracted with toluene, and the organic layer is washed with pure water. Subsequently, the organic layer is dried over anhydrous sodium sulfate, and then the solvent is distilled off under reduced pressure. The residue is recrystallized from hexane, and thereby DAA-2 (34.1 g) is obtained.

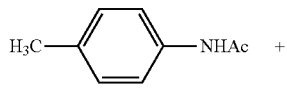

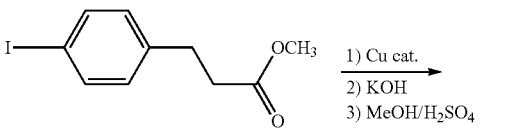

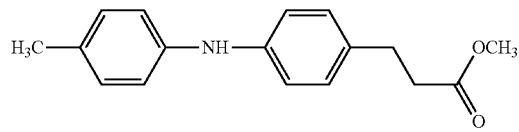

DAA-2

Next, a liquid mixture of 1-bromo-4-iodobenzene (22.8 g), DAA-2 (20.0 g), copper(II) sulfate pentahydrate (1.0 g), potassium carbonate (5.2 g), and tridecane (20 ml) is stirred for 7 hours at 210° C.

After completion of the reaction, potassium hydroxide (15.6 g) dissolved in ethylene glycol (300 ml) is added thereto, and the resulting mixture is heated to reflux for 3.5 hours under a nitrogen gas stream, and then is cooled to room temperature (25° C.). The reaction liquid is poured into 1 L of distilled water and neutralized with hydrochloric acid, and crystals are precipitated out. The crystals are filtered by suction filtration and washed with water, and then the crystals are transferred to a 1-L flask. Toluene (500 ml) is added to this, and the mixture is heated to reflux. Water is removed by azeotropically boiling the reaction mixture, subsequently a methanol (300 ml) solution of concentrated sulfuric acid (1.5 ml) is added thereto, and the resulting mixture is heated to reflux for 5 hours under a nitrogen gas stream.

The reaction mixture is cooled to room temperature (25° C.), toluene is added thereto, and the mixture is filtered through Celite. The filtrate is washed with pure water, and the organic layer is extracted. A product obtained by distilling off the organic solvent of the organic layer is separated by silica gel column chromatography (hexane 4:toluene 1), and thus TAA-3 (16.1 g) is obtained.

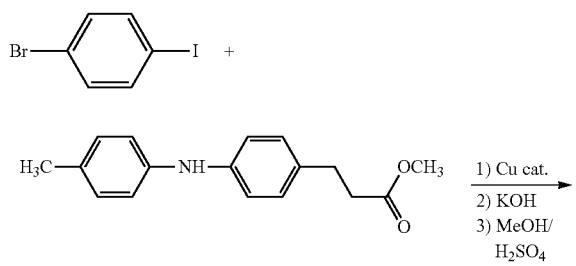

2 M sodium carbonate solution (30 ml), and 2-chloro-5-(5,5-dimethyl-1,3,2-dioxaborinan-2-yl)pyridine (11.4 g) are dissolved in toluene, and the solution is heated to reflux and stirred for 8 hours.

After completion of the reaction, the reaction solution is transferred into a separatory funnel, water and toluene are added thereto, and liquid-liquid partition is carried out. The organic layer is washed with saturated brine, and then is dried over sodium sulfate. The solvent is distilled off under reduced pressure, and thus a crude product is obtained. This is purified by column chromatography (hexane/ethyl acetate 5/1), and thus TAA-4 (5.2 g) is obtained.

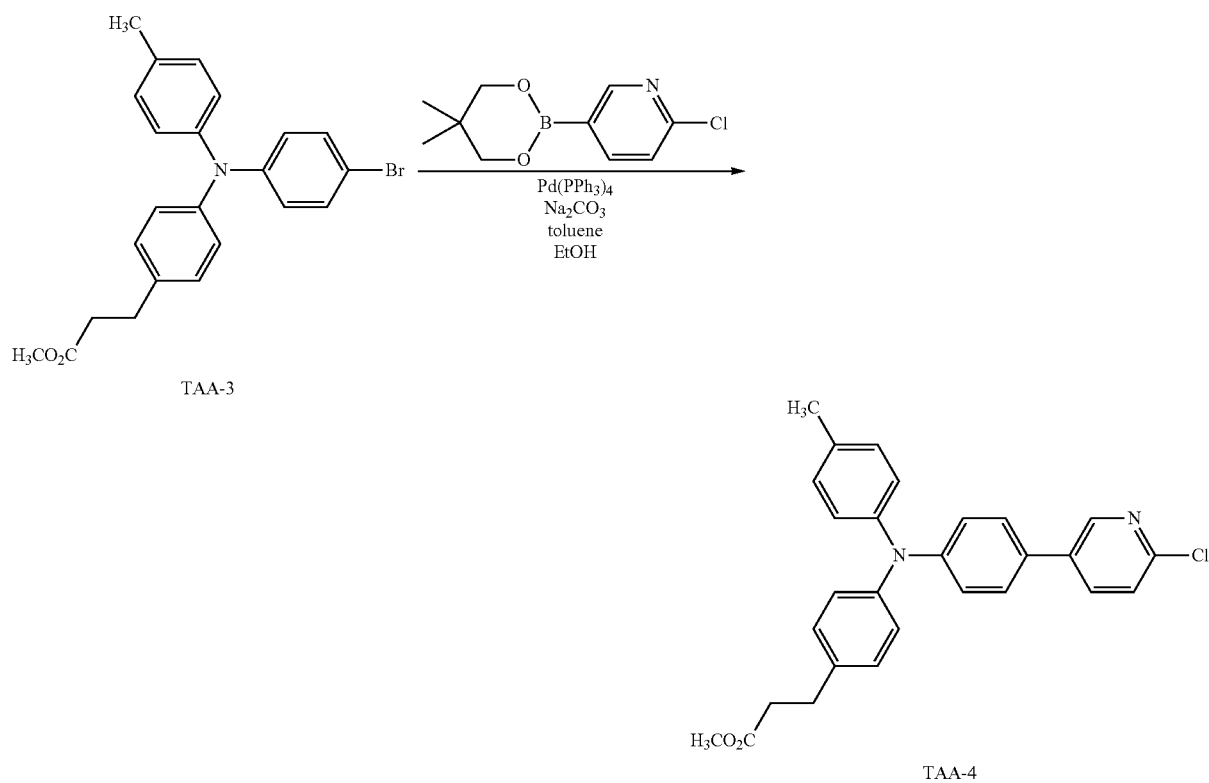

Furthermore, in a nitrogen atmosphere, triphenylphosphine (9.5 g) and nickel (II) chloride (1.5 g) are dissolved in anhydrous DMF (50 ml), and the solution is heated and stirred to 50° C. Zinc (0.6 g) and TAA-4 (4.0 g) are added thereto, and the mixture is heated and stirred for 4 hours at 50° C.

After completion of the reaction, the reaction solution is transferred into a separatory funnel, water and chloroform are added thereto, and liquid-liquid partition is carried out. Furthermore, the aqueous layer is extracted with chloroform, and the organic layer is suction filtered. The filtrate is dried over sodium sulfate. The solvent is distilled off under reduced pressure, water is added to the residue, and the mixture is suction filtered. Thus, a crude product is obtained. This is washed with an aqueous EDTA solution, and then the crude product is purified by column chromatography (hexane/ethyl acetate 2/1). Thus, 1.3 g of a monomer compound (15) is obtained.

-continued

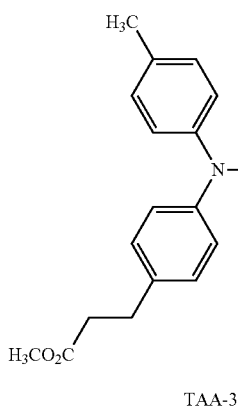

TAA-3

Next, in a nitrogen atmosphere, TAA-3 (14.2 g), tetrakis(triphenylphosphine)palladium(0) (1.1 g), ethanol (30 ml), a

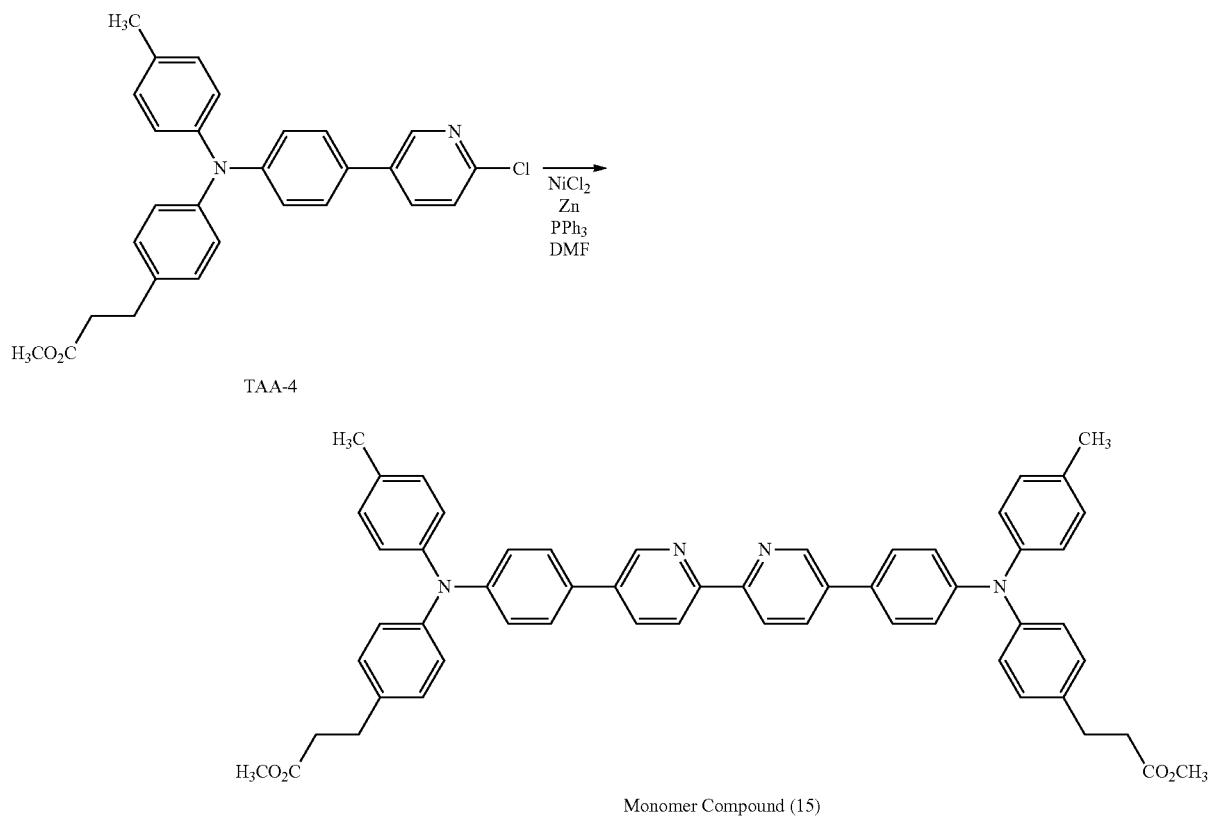 [SMILES: COC(=O)CCc1ccc(N(c2ccc(C)cc2)c2ccc(-c3ccc(Cl)nc3)cc2)cc1 ; "TAA-4" ; COC(=O)CCc1ccc(N(c2ccc(C)cc2)c2ccc(-c3ccc(-c4ccc(-c5ccc(N(c6ccc(C)cc6)c6ccc(CCC(=O)OC)cc6)cc5)cn4)nc3)cc2)cc1]

TAA-4

Monomer Compound (15)

The monomer compound (15) thus obtained (1.0 g), ethylene glycol (10 ml) and tetrabutoxytitanium (0.02 g) are introduced into a 50-ml three-necked pear-shaped flask, and the mixture is heated and stirred for 6 hours at 200° C. in a nitrogen atmosphere. It is confirmed by TLC that the raw material monomer compound (15) has reacted and disappeared, and then the reaction mixture is heated to 210° C., while ethylene glycol is distilled off at a reduced pressure of 50 Pa. The reaction is continued for 6 hours.

Thereafter, the reaction mixture is cooled to room temperature (25° C.), and is dissolved in tetrahydrofuran (50 ml). Any insoluble matter is filtered through a 0.5 μm polytetrafluoroethylene (PTFE) filter, and the filtrate is distilled off under reduced pressure. Subsequently, the residue is dissolved in monochlorobenzene (300 ml), and the solution is washed sequentially with 1 N HCl (300 ml) and water (500 ml×3). The monochlorobenzene solution is distilled off under reduced pressure to a final volume of 30 ml, and the concentrated solution is added dropwise to 800 ml of ethyl acetate/methanol=1/3 to reprecipitate the polymer. The polymer thus obtained is filtered, washed with methanol, and then dried in a vacuum at 60° C. for 16 hours. Thus, 0.6 g of a polymer [Exemplary Compound (17)] is obtained.

The molecular weight of this polymer is measured by gel permeation chromatography (GPC) (manufactured by Tosoh Corp., HLC-8120 GPC), and the weight average molecular weight is Mw=4.6×10$^4$ (relative to styrene standards), Mw/Mn=2.15, and the degree of polymerization p determined from the molecular weight of the monomer is about 55.

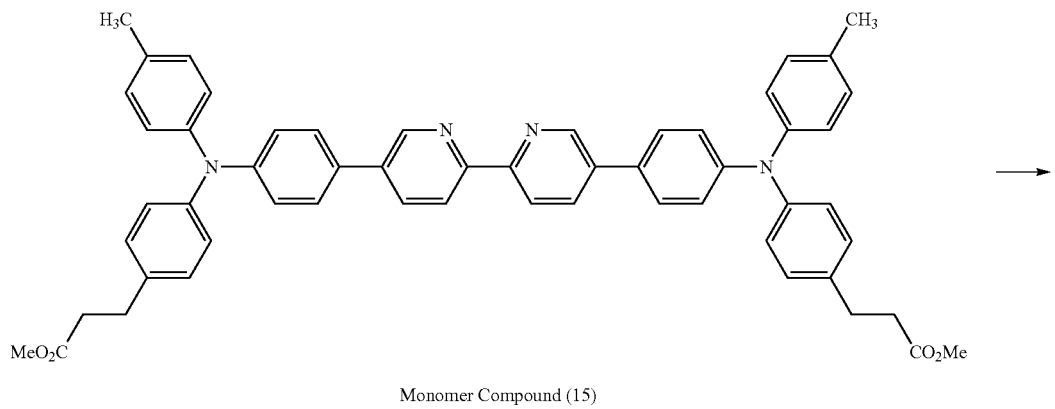

Monomer Compound (15)

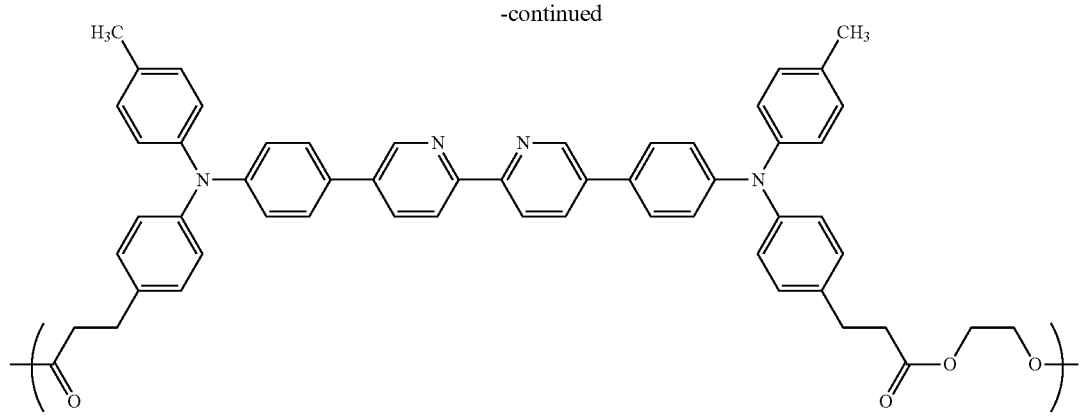

Exemplary Compound (17)

Synthesis Example 3

Synthesis of Exemplary Compound (27)

1-Acetamidonaphthalene (25.0 g), methyl 4-iodophenyl-propionate (64.4 g), potassium carbonate (38.3 g), copper sulfate pentahydrate (2.3 g), and n-tridecane (50 ml) are introduced into a 500-ml three-necked flask, and the mixture is heated and stirred for 20 hours at 230° C. under a nitrogen gas stream.

After completion of the reaction, potassium hydroxide (15.6 g) dissolved in ethylene glycol (300 ml) is added thereto, and the resulting mixture is heated to reflux for 3.5 hours under a nitrogen gas stream, and then is cooled to room temperature (25° C.). The reaction liquid is poured into 1 L of distilled water and neutralized with hydrochloric acid, and crystals are precipitated out. The crystals are filtered by suction filtration and washed with water, and then the crystals are transferred to a 1-L flask. Toluene (500 ml) is added to this, and the mixture is heated to reflux. Water is removed by azeotropically boiling the reaction mixture, subsequently a methanol (300 ml) solution of concentrated sulfuric acid (1.5 ml) is added thereto, and the resulting mixture is heated to reflux for 5 hours under a nitrogen gas stream.

After the reaction, the reaction mixture is extracted with toluene, and the organic layer is washed with pure water. Subsequently, the organic layer is dried over anhydrous sodium sulfate, and the solvent is distilled off under reduced pressure. The residue is recrystallized from hexane, and thereby DAA-3 (36.5 g) is obtained.

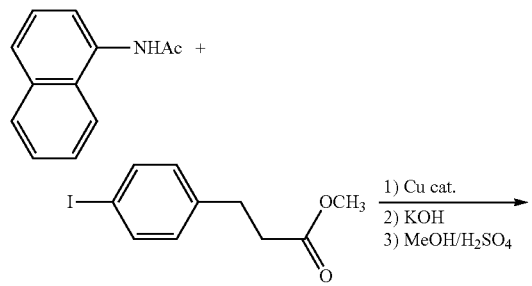

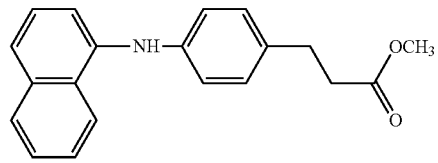

DAA-3

Next, a liquid mixture of 1-bromo-4-iodobenzene (20.3 g), DAA-3 (20.0 g), copper(II) sulfate pentahydrate (1.0 g), potassium carbonate (5.2 g), and tridecane (20 ml) is stirred for 12 hours at 210° C.

After completion of the reaction, potassium hydroxide (15.6 g) dissolved in ethylene glycol (300 ml) is added thereto, and the resulting mixture is heated to reflux for 3.5 hours under a nitrogen gas stream, and then is cooled to room temperature (25° C.). The reaction liquid is poured into 1 L of distilled water and neutralized with hydrochloric acid, and crystals are precipitated out. The crystals are filtered by suction filtration and washed with water, and then the crystals are transferred to a 1-L flask. Toluene (500 ml) is added to this, and the mixture is heated to reflux. Water is removed by azeotropically boiling the reaction mixture, subsequently a methanol (300 ml) solution of concentrated sulfuric acid (1.5 ml) is added thereto, and the resulting mixture is heated to reflux for 5 hours under a nitrogen gas stream.

The reaction mixture is cooled to room temperature (25° C.), toluene is added thereto, and the mixture is filtered through Celite. The filtrate is washed with pure water, and the organic layer is extracted. A product obtained by distilling off the organic solvent of the organic layer is separated by silica gel column chromatography (hexane 4:toluene 1), and thus TAA-5 (17.2 g) is obtained.

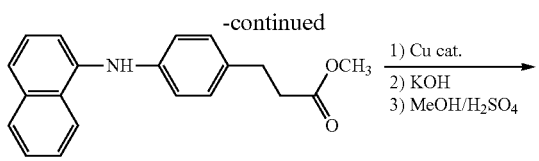

DAA-3

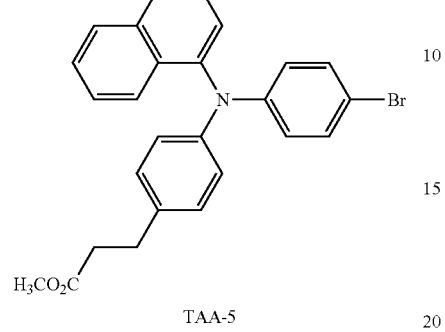

TAA-5

Next, in a nitrogen atmosphere, TAA-5 (15.3 g), tetrakis(triphenylphosphine)palladium(0) (11.1 g), ethanol (30 ml), a 2 M sodium carbonate solution (30 ml), and 2-chloro-5-(5,5-dimethyl-1,3,2-dioxaborinan-2-yl)pyridine (11.4 g) are dissolved in toluene, and the solution is heated to reflux and stirred for 10 hours.

After completion of the reaction, the reaction solution is transferred into a separatory funnel, water and toluene are added thereto, and liquid-liquid partition is carried out. The organic layer is washed with saturated brine, and then is dried over sodium sulfate. The solvent is distilled off under reduced pressure, and a crude product is obtained. This is purified by column chromatography (hexane/ethyl acetate=5/1), and thus TAA-6 (5.5 g) is obtained.

Furthermore, in a nitrogen atmosphere, triphenylphosphine (9.5 g) and nickel (II) chloride (1.5 g) are dissolved in anhydrous DMF (40 ml), and the solution is heated and stirred to 50° C. Zinc (0.6 g) and TAA-6 (4.3 g) are added thereto, and the mixture is heated and stirred for 4 hours at 50° C.

After completion of the reaction, the reaction solution is transferred into a separatory funnel, water and chloroform are added thereto, and liquid-liquid partition is carried out. Furthermore, the aqueous layer is extracted with chloroform, and the organic layer is suction filtered. The filtrate is dried over sodium sulfate. The solvent is distilled off under reduced pressure, water is added to the residue, and the mixture is suction filtered. Thus, a crude product is obtained. This is washed with an aqueous EDTA solution, and then the product is purified by column chromatography (hexane/ethyl acetate=2/1). Thus, 1.1 g of a monomer compound (24) is obtained.

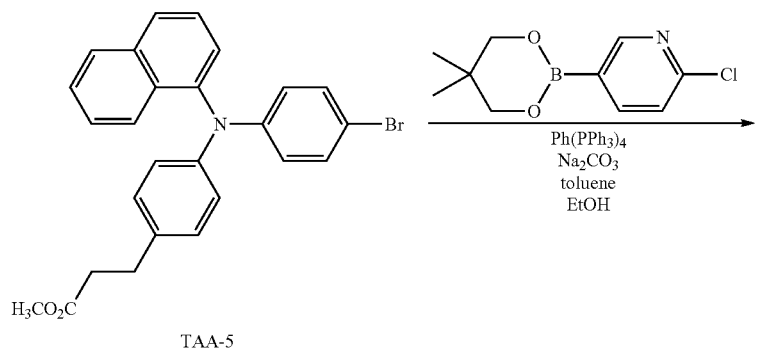

TAA-5

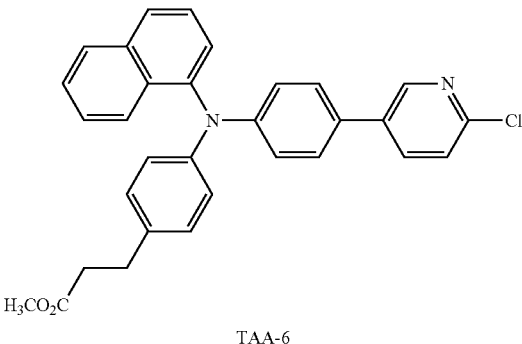

TAA-6

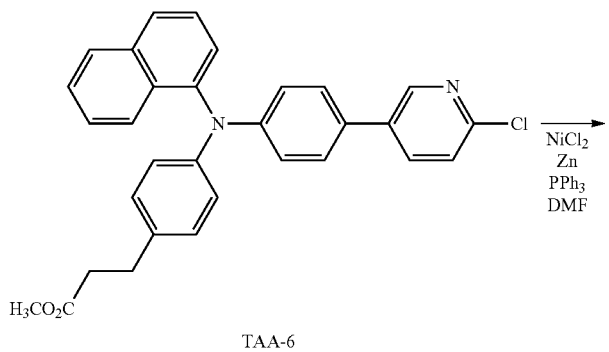

TAA-6

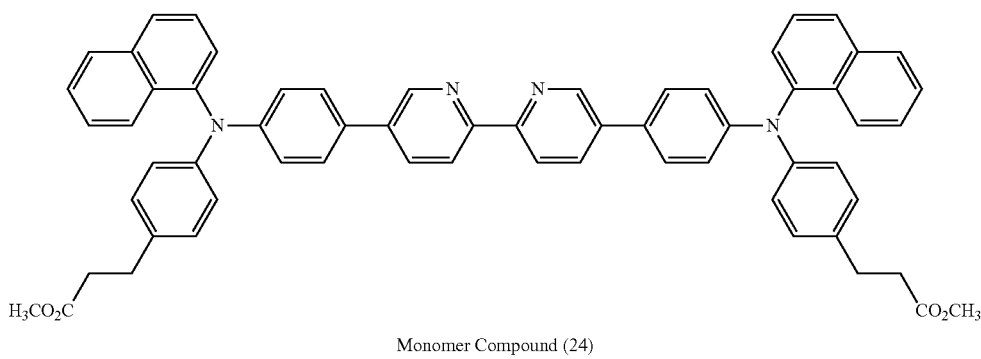

Monomer Compound (24)

The monomer compound (24) thus obtained (1.0 g), ethylene glycol (10 ml) and tetrabutoxytitanium (0.02 g) are introduced into a 50-ml three-necked pear-shaped flask, and in a nitrogen atmosphere, the mixture is heated and stirred for 7 hours at 200° C. It is confirmed by TLC that the raw material monomer compound (24) has reacted and disappeared, and then the reaction mixture is heated to 210° C., while ethylene glycol is distilled off at a reduced pressure of 50 Pa. The reaction is continued for 6 hours.

Thereafter, the reaction mixture is cooled to room temperature (25° C.), and is dissolved in tetrahydrofuran (50 ml). Any insoluble matter is filtered through a 0.5-μm polytetrafluoroethylene (PTFE) filter, and the filtrate is distilled off under reduced pressure. Subsequently, the residue is dissolved in monochlorobenzene (300 ml), and the solution is washed sequentially with 1 N HCl (300 ml) and water (500 ml×3). The monochlorobenzene solution is distilled off under reduced pressure to a final volume of 30 ml, and the concentrated solution is added dropwise to 800 ml of ethyl acetate/methanol=1/3 to reprecipitate the polymer. The polymer thus obtained is filtered, washed with methanol, and then dried in a vacuum at 60° C. for 16 hours. Thus, 0.5 g of a polymer [Exemplary Compound (27)] is obtained.

The molecular weight of this polymer is measured by gel permeation chromatography (GPC) (manufactured by Tosoh Corp., HLC-8120 GPC), and the weight average molecular weight is $Mw=6.0\times10^4$ (relative to styrene standards), $Mw/Mn=2.15$, and the degree of polymerization p determined from the molecular weight of the monomer is about 64.

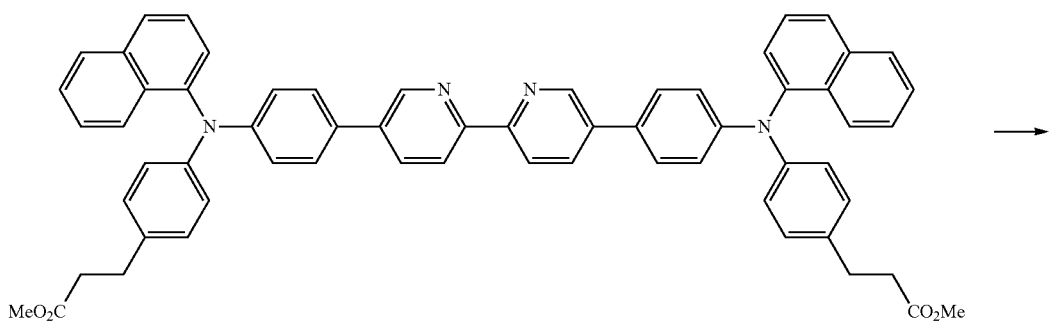

Monomer Compound (24)

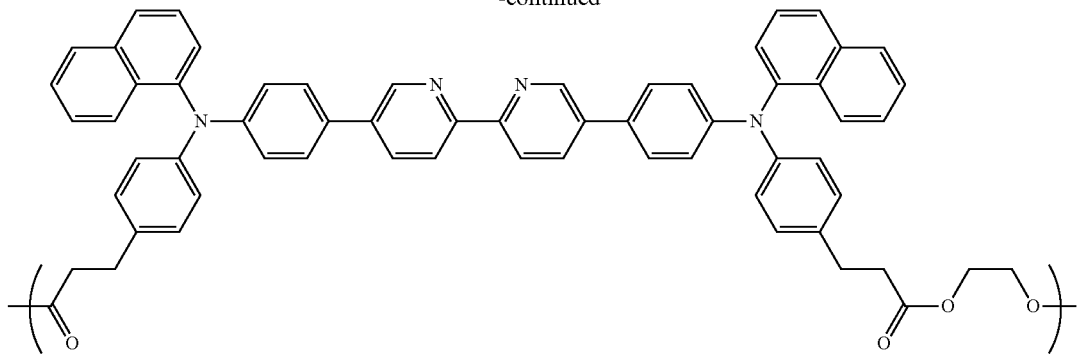

Exemplary Compound (27)

Synthesis Example 4

Synthesis of Exemplary Compound (26)

In a nitrogen atmosphere, a liquid mixture of 1-bromo-4-iodobenzene (19.2 g), DAA-4 (20.0 g), copper(II) sulfate pentahydrate (1.0 g), potassium carbonate (5.2 g) and tridecane (25 ml) is stirred for 18 hours at 210° C.

After completion of the reaction, potassium hydroxide (15.6 g) dissolved in ethylene glycol (300 ml) is added thereto, and the resulting mixture is heated to reflux for 3.5 hours under a nitrogen gas stream, and then is cooled to room temperature (25° C.). The reaction liquid is poured into 1 L of distilled water and neutralized with hydrochloric acid, and crystals are precipitated out. The crystals are filtered by suction filtration and washed with water, and then the crystals are transferred to a 1-L flask. Toluene (500 ml) is added to this, and the mixture is heated to reflux. Water is removed by azeotropically boiling the reaction mixture, subsequently a methanol (300 ml) solution of concentrated sulfuric acid (1.5 ml) is added thereto, and the resulting mixture is heated to reflux for 5 hours under a nitrogen gas stream.

The reaction mixture is cooled, toluene is added thereto, and the mixture is filtered through Celite. A product obtained by distilling toluene is separated by silica gel column chromatography (hexane 2:toluene 1), and thus TAA-7 (14.5 g) is obtained.

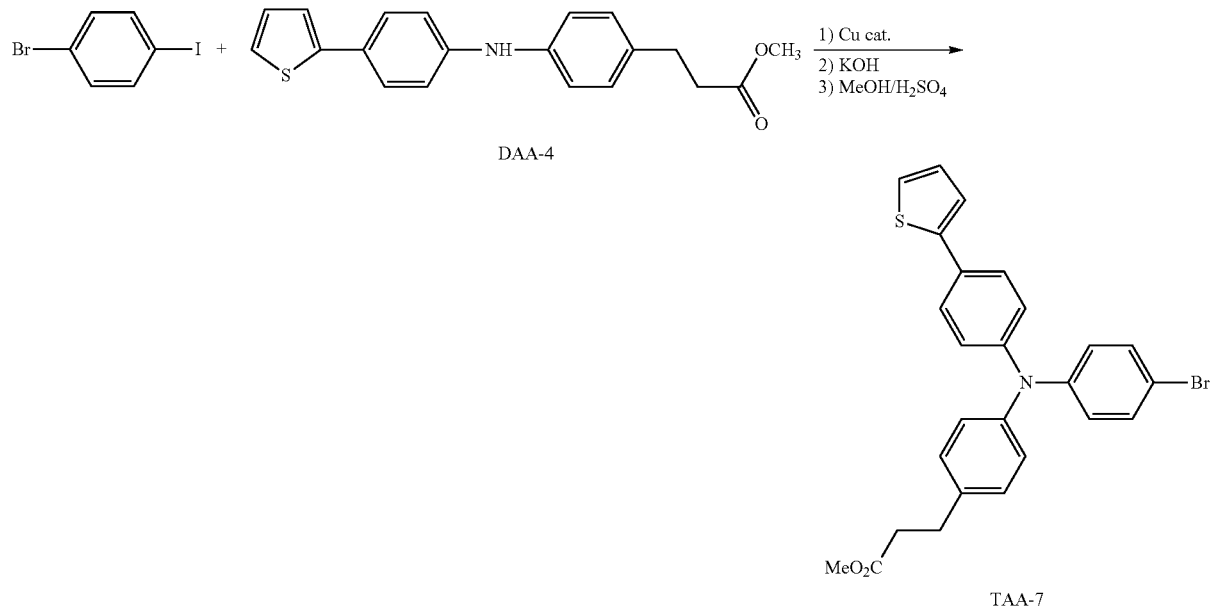

Next, in a nitrogen atmosphere, TAA-7 (16.4 g), tetrakis(triphenylphosphine)palladium(0) (1.1 g), ethanol (30 ml), a 2 M sodium carbonate solution (30 ml), and 2-chloro-5-(5,5-dimethyl-1,3,2-dioxaborinan-2-yl)pyridine (11.4 g) are dissolved in toluene, and the solution is heated to reflux and stirred for 8 hours.

After completion of the reaction, the reaction solution is transferred into a separatory funnel, water and toluene are added thereto, and liquid-liquid partition is carried out. The organic layer is washed with saturated brine, and then is dried over sodium sulfate. The solvent is distilled off under reduced pressure, and a crude product is obtained. This is purified by column chromatography (hexane/ethyl acetate=5/1), and thus TAA-8 (5.8 g) is obtained.

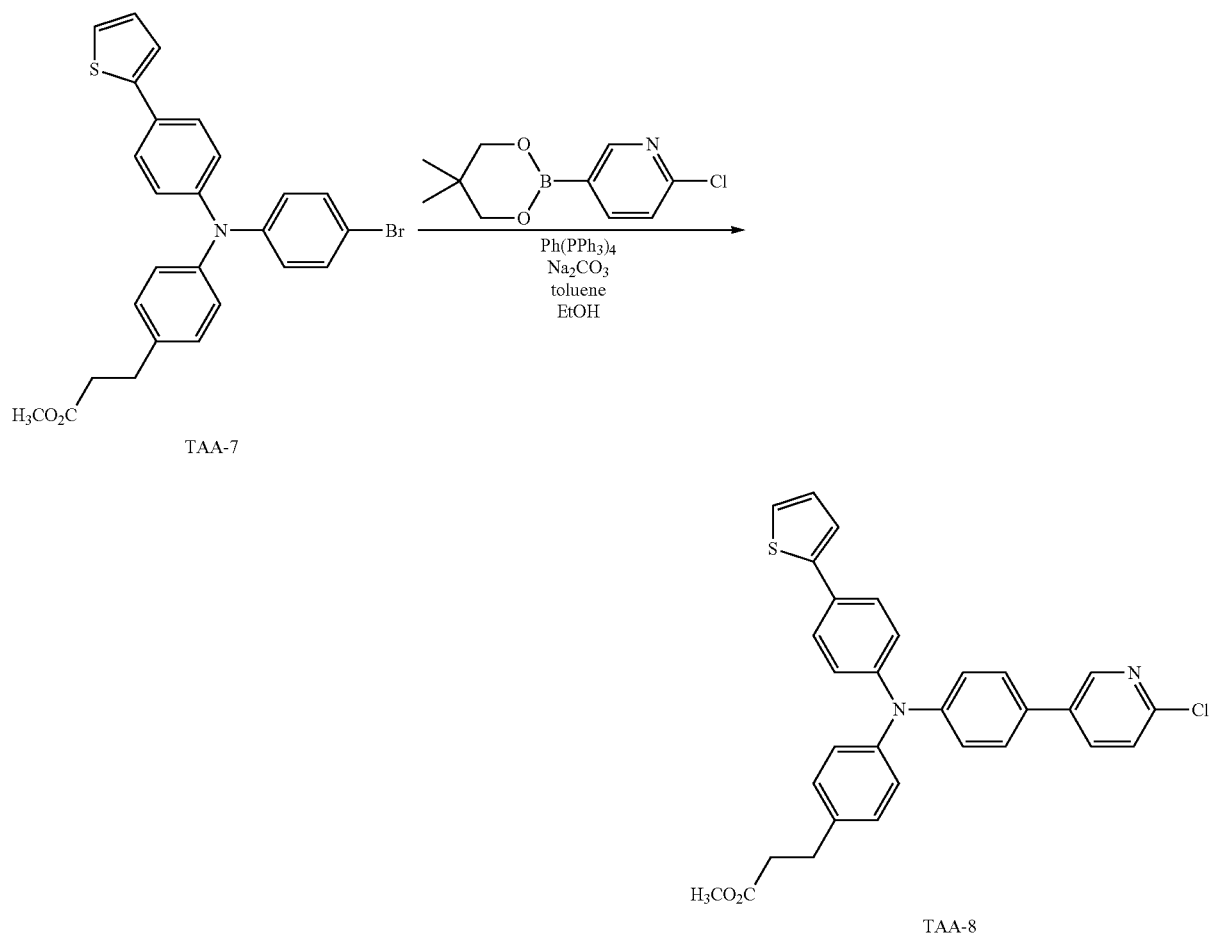

Furthermore, in a nitrogen atmosphere, triphenylphosphine (9.5 g) and nickel (II) chloride (1.5 g) are dissolved in anhydrous DMF (40 ml), and the solution is heated and stirred to 50° C. Zinc (0.6 g) and TAA-8 (4.6 g) are added thereto, and the mixture is heated and stirred for 4 hours at 50° C.

After completion of the reaction, the reaction solution is transferred into a reparatory funnel, water and chloroform are added thereto, and liquid-liquid partition is carried out. Furthermore, the aqueous layer is extracted with chloroform, the organic layer is suction filtered, and the filtrate is dried over sodium sulfate. The solvent is distilled off under reduced pressure, water is added thereto, and the mixture is suction filtered. Thus, a crude product is obtained. This is washed with an aqueous EDTA solution, and then is purified by column chromatography (hexane/ethyl acetate=2/1). Thus, 1.3 g of a monomer compound (23) is obtained.

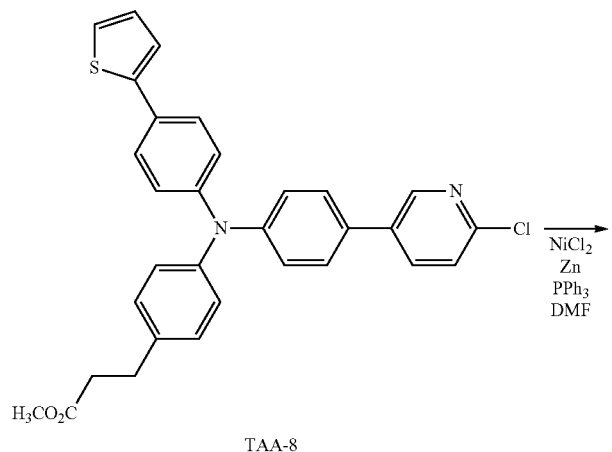

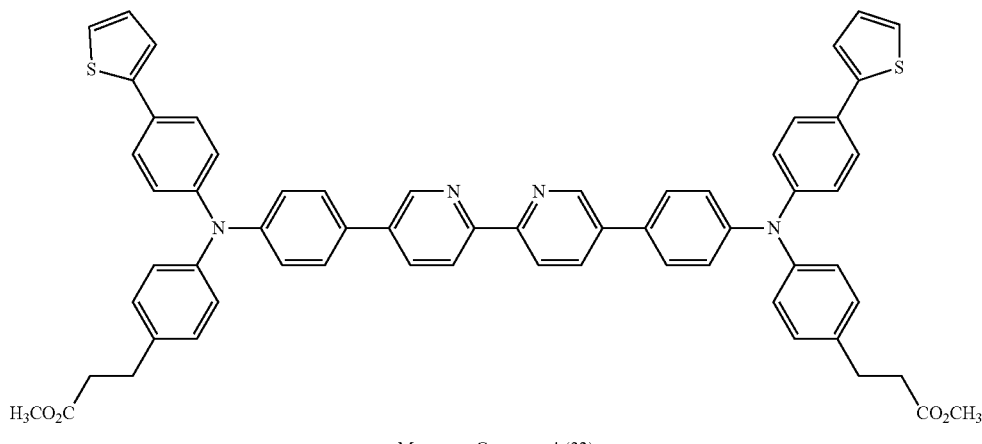

Monomer Compound (23)

1.0 g of the monomer compound (23) thus obtained, ethylene glycol (10 ml) and tetrabutoxytitanium (0.02 g) are introduced into a 50-ml three-necked pear-shaped flask, and in a nitrogen atmosphere, the mixture is heated and stirred for 5 hours at 200° C. It is confirmed by TLC that the raw material monomer compound (23) has reacted and disappeared, and then, the reaction mixture is heated to 210° C., while ethylene glycol is distilled off at a reduced pressure of 50 Pa. The reaction is continued for 6 hours. Thereafter, the reaction mixture is cooled to room temperature (25° C.), and is dissolved in tetrahydrofuran (50 ml). Any insoluble matter is filtered through a 0.5-μm polytetrafluoroethylene (PTFE) filter, and the filtrate is distilled off under reduced pressure. Subsequently, the residue is dissolved in monochlorobenzene (300 ml), and the solution is washed sequentially with 1 N HCl (300 ml) and water (500 ml×3). The monochlorobenzene solution is distilled off under reduced pressure to a final volume of 30 ml, and the concentrated solution is added dropwise to 800 ml of ethyl acetate/methanol=1/3 to reprecipitate the polymer. The polymer thus obtained is filtered, washed with methanol, and then dried in a vacuum at 60° C. for 16 hours. Thus, 0.7 g of a polymer [Exemplary Compound (26)] is obtained.

The molecular weight of this polymer is measured by gel permeation chromatography (GPO) (manufactured by Tosoh Corp., HLC-8120 GPC), and the weight average molecular weight is Mw=4.7×10$^4$ (relative to styrene standards), Mw/Mn=2.43, and the degree of polymerization p determined from the molecular weight of the monomer is about 48.

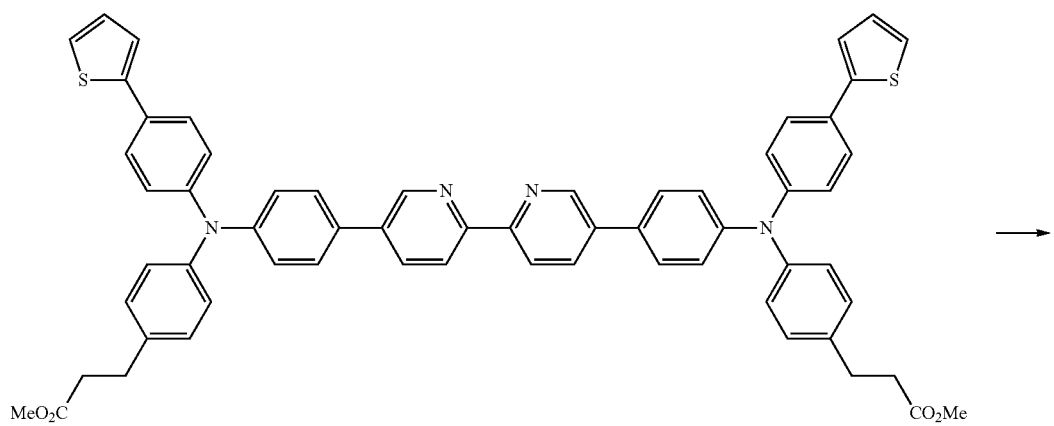

Monomer Compound (23)

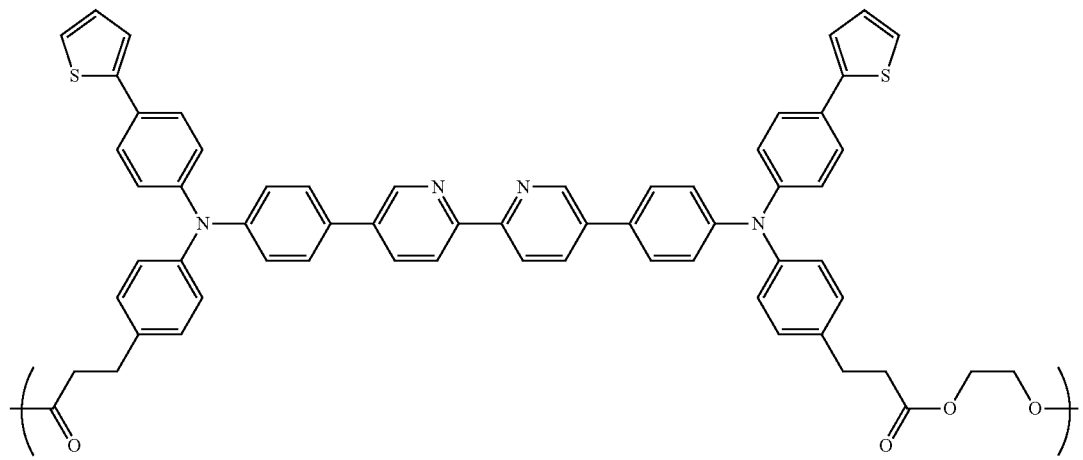

Exemplary Compound (26)

Synthesis Example 5

Synthesis of Exemplary Compound (18)

A liquid mixture of 1-bromo-4-iodobenzenen (21.0 g), DAA-5 (20.0 g), copper(II) sulfate pentahydrate (1.0 g), potassium carbonate (5.2 g) and tridecane (20 ml) is stirred for 7 hours at 210° C.

After completion of the reaction, potassium hydroxide (15.6 g) dissolved in ethylene glycol (300 ml) is added thereto, and the resulting mixture is heated to reflux for 3.5 hours under a nitrogen gas stream, and then is cooled to room temperature (25° C.). The reaction liquid is poured into 1 L of distilled water and neutralized with hydrochloric acid, and crystals are precipitated out. The crystals are filtered by suction filtration and washed with water, and then the crystals are transferred to a 1-L flask. Toluene (500 ml) is added to this, and the mixture is heated to reflux. Water is removed by azeotropically boiling the reaction mixture, subsequently a methanol (300 ml) solution of concentrated sulfuric acid (1.5 ml) is added thereto, and the resulting mixture is heated to reflux for 5 hours under a nitrogen gas stream.

The reaction mixture is cooled to room temperature (25° C.), toluene is added thereto, and the mixture is filtered through Celite. The filtrate is washed with pure water, and the organic layer is extracted. A product obtained by distilling off the organic solvent is separated by silica gel column chromatography (hexane 4:toluene 1), and thus TAA-9 (14.3 g) is obtained.

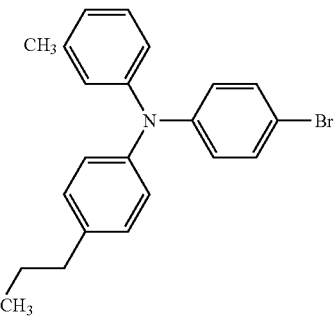

TAA-9

Next, in a nitrogen atmosphere, TAA-9 (14.2 g), tetrakis (triphenylphosphine)palladium(0) (1.1 g), ethanol (30 ml), a 2 M sodium carbonate solution (30 ml) and 2-chloro-5-(5,5-dimethyl-1,3,2-dioxaborinan-2-yl)pyridine (11.4 g) are dissolved in toluene, and the solution is heated to reflux and stirred for 6 hours.

After completion of the reaction, the reaction solution is transferred into a separatory funnel, water and toluene are added thereto, and liquid-liquid partition is carried out. The organic layer is washed with saturated brine, and then is dried over sodium sulfate. The solvent is distilled off under reduced pressure, and a crude product is obtained. This is purified by column chromatography (hexane/ethyl acetate=5/1), and thus TAA-10 (4.1 g) is obtained.

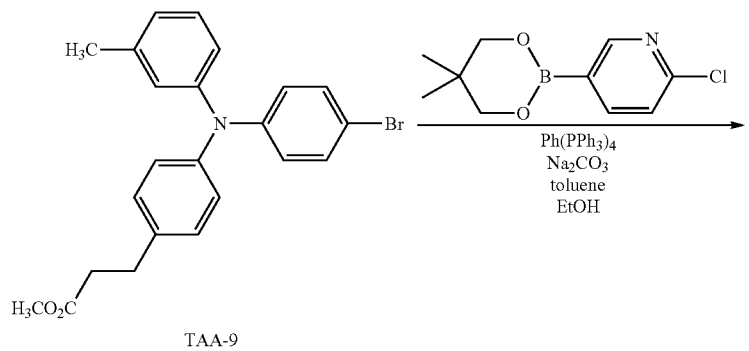

TAA-9

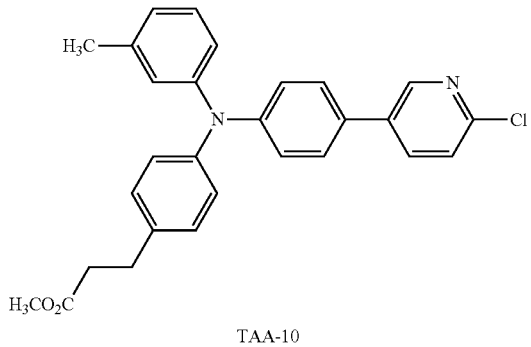

TAA-10

Furthermore, in a nitrogen atmosphere, triphenylphosphine (9.5 g) and nickel (II) chloride (1.5 g) are dissolved in anhydrous DMF (40 ml), and the solution is heated and stirred to 50° C. Zinc (0.6 g) and TAA-10 (3.9 g) are added thereto, and the mixture is heated and stirred for 4 hours at 50° C.

After completion of the reaction, the reaction solution is transferred into a separatory funnel, water and chloroform are added thereto, and liquid-liquid partition is carried out. Furthermore, the aqueous layer is extracted with chloroform, and the organic layer is suction filtered. The filtrate is dried over sodium sulfate. The solvent is distilled off under reduced pressure, water is added to the residue, and the mixture is suction filtered. Thus, a crude product is obtained. This is washed with an aqueous EDTA solution, and then the product is purified by column chromatography (hexane/ethyl acetate=2/1). Thus, 1.4 g of a monomer compound (16) is obtained.

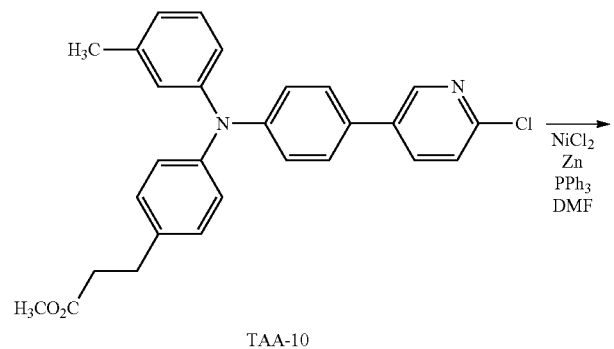

TAA-10

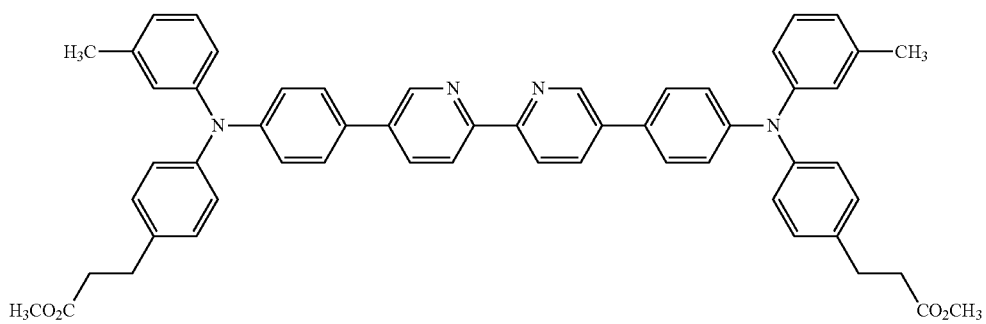

Monomer Compound (16)

The monomer compound (16) thus obtained (1.0 g), ethylene glycol (10 ml) and tetrabutoxytitanium (0.02 g) are introduced into a 50-ml three-necked pear-shaped flask, and in a nitrogen atmosphere, the mixture is heated and stirred for 5 hours at 200° C. It is confirmed by TLC that the raw material monomer compound (16) has reacted and disappeared, and then the reaction mixture is heated to 210° C., while ethylene glycol is distilled off at a reduced pressure of 50 Pa. The reaction is continued for 6 hours. Thereafter, the reaction mixture is cooled to room temperature (25° C.), and is dissolved in tetrahydrofuran (50 ml). Any insoluble matter is filtered through a 0.5-μm polytetrafluoroethylene (PTFE) filter, and the filtrate is distilled off under reduced pressure. Subsequently, the residue is dissolved in monochlorobenzene (300 ml), and the solution is washed sequentially with 1 N HCl (300 ml) and water (500 ml×3). The monochlorobenzene solution is distilled off under reduced pressure to a final volume of 30 ml, and the concentrated solution is added dropwise to 800 ml of ethyl acetate/methanol 1/3 to reprecipitate the polymer. The polymer thus obtained is filtered, washed with methanol, and then dried in a vacuum at 60° C. for 16 hours. Thus, 0.7 g of a polymer [Exemplary Compound (18)] is obtained.

The molecular weight of this polymer is measured by gel permeation chromatography (GPC) (manufactured by Tosoh Corp., HLC-8120 GPC), and the weight average molecular weight is Mw=6.1×10$^4$ (relative to styrene standards), Mw/Mn=2.31, and the degree of polymerization p determined from the molecular weight of the monomer is about 72.

Synthesis Example 6

Synthesis of Exemplary Compound (25)

In a nitrogen atmosphere, a liquid mixture of 3-bromobiphenyl (26.3 g), DA-6 (28.0 g), copper (II) sulfate pentahydrate (1.2 g), potassium carbonate (7.3 g), and tridecane (30 ml) is stirred for 20 hours at 210° C.

After completion of the reaction, potassium hydroxide (15.6 g) dissolved in ethylene glycol (300 ml) is added thereto, and the resulting mixture is heated to reflux for 3.5 hours under a nitrogen gas stream, and then is cooled to room temperature (25° C.). The reaction liquid is poured into 1 L of distilled water and neutralized with hydrochloric acid, and crystals are precipitated out. The crystals are filtered by suction filtration and washed with water, and then the crystals are transferred to a 1-L flask. Toluene (500 ml) is added to this, and the mixture is heated to reflux. Water is removed by azeotropically boiling the reaction mixture, subsequently a methanol (300 ml) solution of concentrated sulfuric acid (1.5 ml) is added thereto, and the resulting mixture is heated to reflux for 5 hours under a nitrogen gas stream.

The mixture is cooled, toluene is added thereto, and the mixture is filtered through Celite. A product obtained by

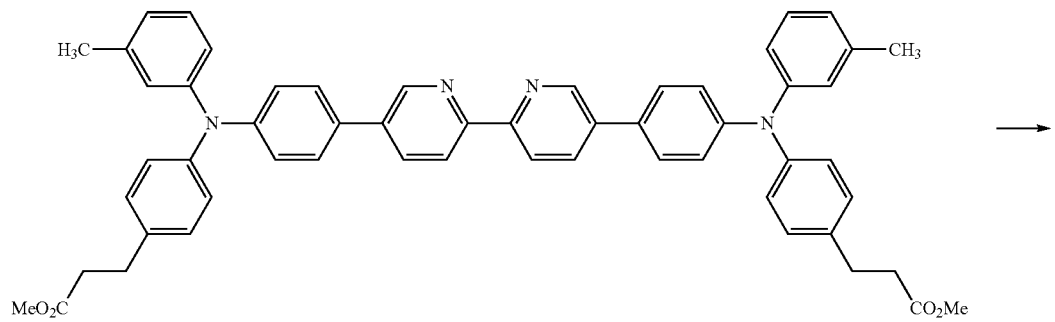

Monomer Compound (16)

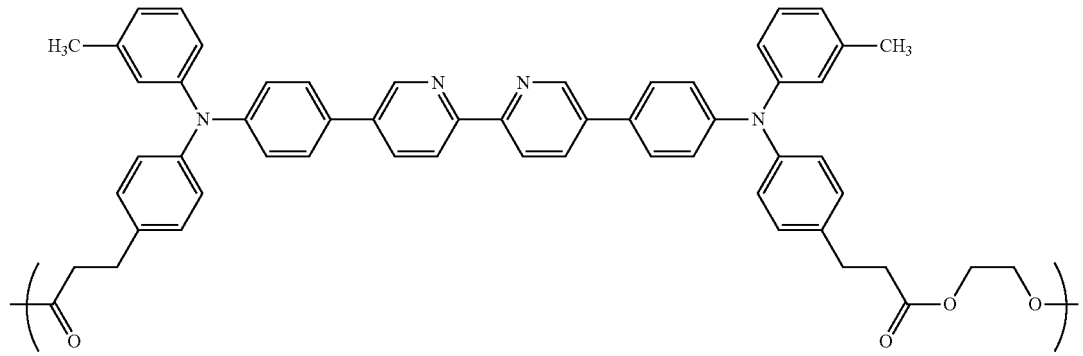

Exemplary Compound (18)

distilling toluene is separated by silica gel column chromatography (toluene), and thus, TAA-11 (18.5 g) is obtained.

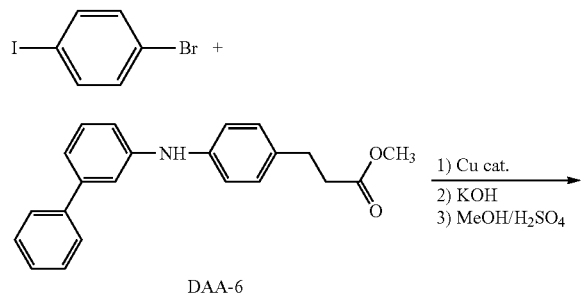

Next, in a nitrogen atmosphere, TAA-11 (16.2 g), tetrakis(triphenylphosphine)palladium(0) (1.1 g), ethanol (30 ml), a 2 M sodium carbonate solution (30 ml), and 2-chloro-5-(5,5-dimethyl-1,3,2-dioxaborinan-2-yl)pyridine (11.4 g) are dissolved in toluene, and the solution is heated to reflux and stirred for 6 hours.

After completion of the reaction, the reaction solution is transferred into a reparatory funnel, water and toluene are added thereto, and liquid-liquid partition is carried out. The organic layer is washed with saturated brine, and then is dried over sodium sulfate. The solvent is distilled off under reduced pressure, and thus a crude product is obtained. This is purified by column chromatography (hexane/ethyl acetate=5/1), and thus TAA-12 (5.2 g) is obtained.

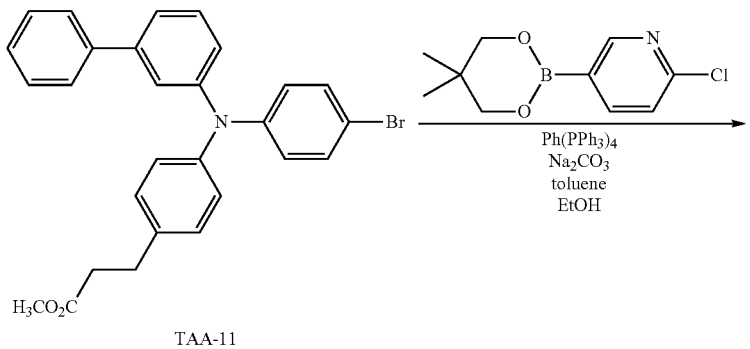

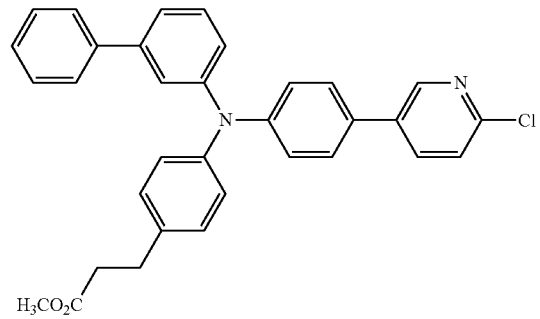

-continued

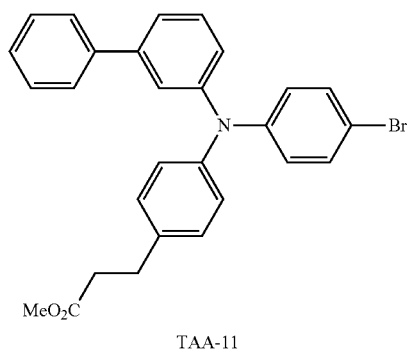

Furthermore, under a nitrogen atmosphere, triphenylphosphine (9.5 g) and nickel (II) chloride (1.5 g) are dissolved in anhydrous DMF (40 ml), and the solution is heated and stirred to 50° C. Zinc (0.6 g) and TAA-12 (4.5 g) are added thereto, and the mixture is heated and stirred for 4 hours at 50° C.

After completion of the reaction, the reaction solution is transferred to a separatory funnel, water and chloroform are added thereto, and liquid-liquid partition is carried out. Furthermore, the aqueous layer is extracted with chloroform, and the organic layer is suction filtered. The filtrate is dried over sodium sulfate. The solvent is distilled off under reduced pressure, water is added to the residue, and the mixture is suction filtered. Thus, a crude product is obtained. This is washed with an aqueous EDTA solution, and then the product is purified by column chromatography (hexane/ethyl acetate 2/1). Thus, 1.2 g of a monomer compound (22) is obtained.

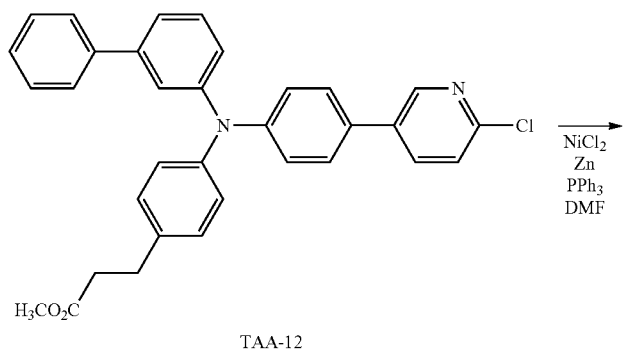

TAA-12

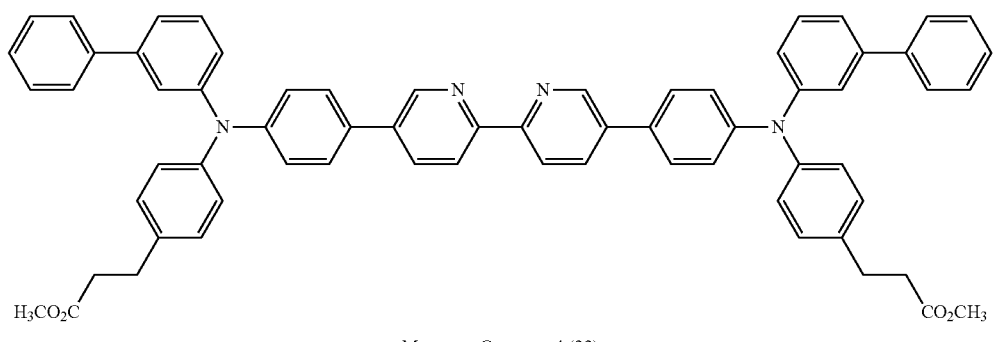

Monomer Compound (22)

1.0 g of the monomer compound (22) thus obtained, ethylene glycol (10 ml) and tetrabutoxytitanium (0.02 g) are introduced into a 50-ml three-necked pear-shaped flask, and in a nitrogen atmosphere, the mixture is heated and stirred for 5 hours at 200° C. It is confirmed by TLC that the raw material monomer compound (22) has reacted and disappeared, and then the reaction mixture is heated to 210° C., while ethylene glycol is distilled off at a reduced pressure of 50 Pa. The reaction is continued for 6 hours. Thereafter, the reaction mixture is cooled to room temperature (25° C.), and is dissolved in tetrahydrofuran (50 ml). Any insoluble matter is filtered through a 0.5-μm polytetrafluoroethylene (PTFE) filter, and the filtrate is distilled off under reduced pressure. Subsequently, the residue is dissolved in monochlorobenzene (300 ml), and the solution is washed sequentially with 1 N HCl (300 ml) and water (500 ml×3). The monochlorobenzene solution is distilled off under reduced pressure to a final volume of 30 ml, and the concentrated solution is added dropwise to 800 ml of ethyl acetate/methanol=1/3 to reprecipitate the polymer. The polymer thus obtained is filtered, washed with methanol, and then dried in a vacuum at 60° C. for 16 hours. Thus, 0.5 g of a polymer [Exemplary Compound (25)] is obtained.

The molecular weight of this polymer is measured by gel permeation chromatography (GPC) (manufactured by Tosoh Corp., HLC-8120 GPC), and the weight average molecular weight is $Mw=5.4\times10^4$ (relative to styrene standards), $Mw/Mn=2.34$, and the degree of polymerization p determined from the molecular weight of the monomer is about 56.

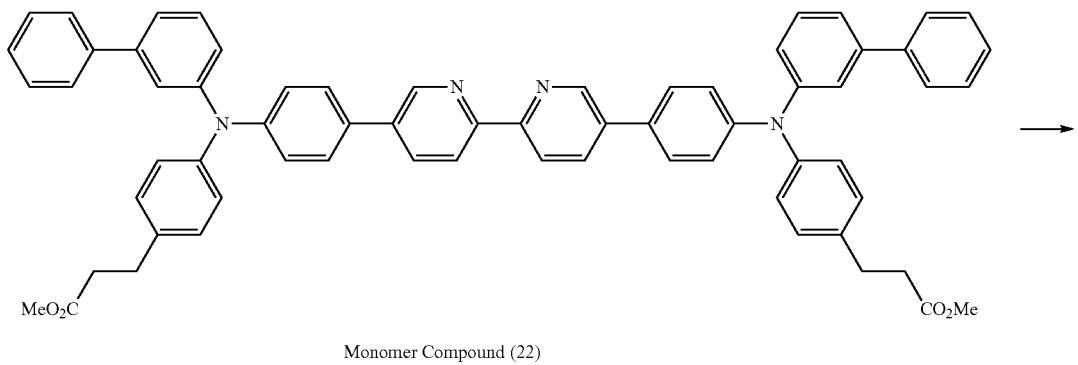

Monomer Compound (22)

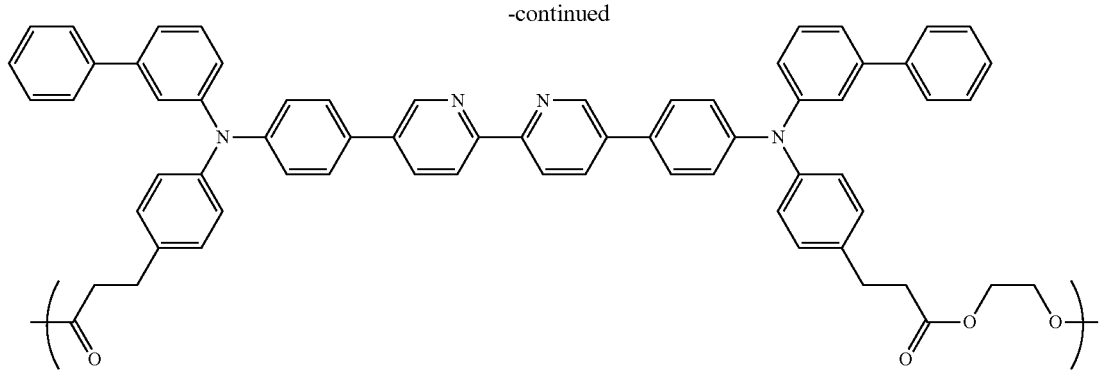

Exemplary Compound (25)

Example 1

ITO (manufactured by Sanyo Vacuum Industries Co., Ltd.) formed on a transparent insulating substrate is subjected to patterning by photolithography using a strip-shaped photomask, and the ITO is further subjected to an etching treatment. Thereby, a strip-shaped ITO electrode (width 2 mm) is formed. Subsequently, this ITO glass substrate is washed with a neutral detergent, ultrapure water, acetone (electronic grade, manufactured by Kanto Chemical Co., Inc.) and isopropanol (electronic grade, manufactured by Kanto Chemical Co., Inc.) while applying ultrasonic waves for 5 minutes for each, and then the ITO glass substrate is dried with a spin coater.

A 5% by weight monochlorobenzene solution of the charge transporting polyester [Exemplary Compound (15)] is prepared, the solution is filtered through a 0.2-μm PTFE filter, and then a thin film having a thickness of 0.050 μm of this solution is formed, as a hole transport layer, on the above-described substrate by a spin coating method. The Exemplary Compound (XV-1) is deposited as a light emitting material, and a light emitting layer having a thickness of 0.055 μm is formed.

Subsequently, a metal mask provided with strip-shaped holes is provided thereon, and then LiF is deposited to a thickness of 0.0001 μm. Subsequently, Al is deposited to a thickness of 0.1.50 μm, and then a back surface electrode having a width of 2 mm and a thickness of 0.15 μm is formed so as to intersect with the ITO electrode. The effective area of the organic electroluminescent element thus formed is 0.04 $cm^2$.

Example 2

A 10% by weight dichloroethane solution of 1 part by weight of the charge transporting polyester [Exemplary Compound (17)], 4 parts by weight of poly(N-vinylcarbazole) and 0.02 part by weight of the Exemplary Compound (XVI-1) is prepared, and the solution is filtered through a 0.2-μm PTFE filter. On a glass substrate on which a strip-shaped ITO electrode has been etched, washed and dried in the same manner as in Example 1, a thin film having a thickness of 0.15 μm is formed using the above solution by a spin coating method. After the thin film is sufficiently dried, LiF is deposited to a thickness of 0.0001 μm by installing a metal mask provided with strip-shaped holes. Subsequently, Al is deposited to a thickness of 0.150 μm, and a back surface electrode having a width of 2 mm and a thickness of 0.15 μm is formed so as to intersect with the ITO electrode. The effective area of the organic electroluminescent element thus formed is 0.04 $cm^2$.

Example 3

On an ITO glass substrate which has been etched, washed in the same manner as in Example 1, a hole transport layer having a thickness of 0.050 μm is formed, using the charge transporting polyester [Exemplary Compound (18)] in the same manner as in Example 1. Subsequently, a mixture of the Exemplary Compound (XV-1) and the Exemplary Compound (XVI-1) (weight ratio: 99/1) is used to form a layer having a thickness of 0.065 μm as a light emitting layer. As an electron transport layer, the Exemplary Compound (XV-9) is used to form a layer having a thickness of 0.030 μm. After the layers are sufficiently dried, LiF is deposited to a thickness of 0.0001 μm by installing a metal mask provided with strip-shaped holes. Subsequently, Al is deposited to a thickness of 0.150 μm, and a back surface electrode having a width of 2 mm and a thickness of 0.15 μm is formed so as to intersect with the ITO electrode. The effective area of the organic electroluminescent element thus formed is 0.04 $cm^2$.

Example 4

On an ITO glass substrate which has been etched, washed and dried in the same manner as in Example 1, a layer having a thickness of 0.050 μm is formed, as a hole transport layer, by an inkjet method (a piezoinkjet system) using the charge transporting polyester [Exemplary Compound (25)] in the same manner as in Example 1. Subsequently, as a light emitting layer, a layer of the Exemplary Compound (XV-16, n=8) containing 5% by weight of the Exemplary Compound (XVI-5) is formed to a thickness of 0.065 μm by a spin coating method. After the layers are sufficiently dried, Ca is deposited to a thickness of 0.08 μm, Al is deposited to a thickness of 0.15 and a back surface electrode having a width of 2 mm and a thickness of 0.23 μm is formed so as to intersect with the ITO electrode. The effective area of the organic electroluminescent element thus formed is 0.04 $cm^2$.

Example 5

An organic electroluminescent element is produced in the same manner as in Example 3, except that the charge transporting polyester [Exemplary Compound (25)] is used

Example 6

An organic electroluminescent element is produced in the same manner as in Example 3, except that the charge transporting polyester [Exemplary Compound (26)] is used instead of the charge transporting polyester [Exemplary Compound (18)] used in Example 3.

Example 7

An organic electroluminescent element is produced in the same manner as in Example 3, except that the charge transporting polyester [Exemplary Compound (27)] is used instead of the charge transporting polyester [Exemplary Compound (18)] used in Example 3.

through a 0.2-μm PTFE filter. This solution is used to form an electron transport layer having a thickness of 0.015 μm formed on the light emitting layer by a spin coating method. After the layers are sufficiently dried, LiF is deposited to a thickness of 0.0001 μm using a metal mask provided with strip-shaped holes, Al is deposited to a thickness of 0.150 μm, and a back surface electrode having a width of 2 mm and a thickness of 0.15 μm is formed so as to intersect with the ITO electrode. The effective area of the organic electroluminescent element thus formed is 0.04 cm².

Comparative Example 1

An organic EL element is produced in the same manner as in Example 3, except that a compound represented by the following structural formula (XVII) is used instead of the charge transporting polyester [Exemplary Compound (18)] used in Example 3.

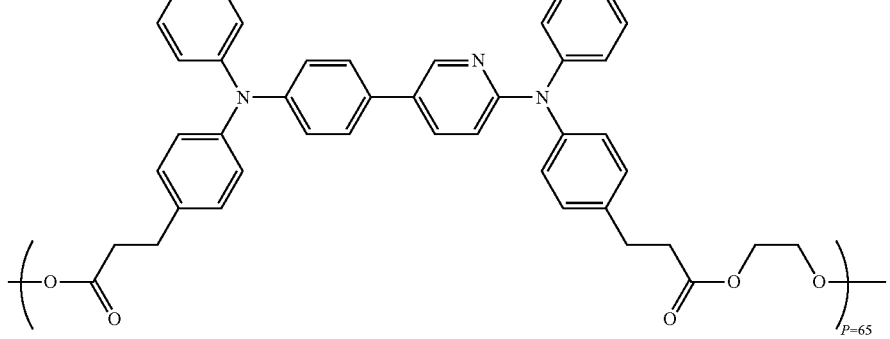

(XVII)

Example 8

A 1.5% by weight dichloroethane solution of a charge transporting polyester [Exemplary Compound (15)] is prepared, and the solution is filtered through a 0.2-μm PTFE filter. On an ITO glass substrate which has been etched, washed and dried in the same manner as in Example 1, a thin film having a thickness of 0.05 μm is formed by an inkjet method using the above solution. Subsequently, the Exemplary Compound (XV-16, n=8) containing 5% by weight of the Exemplary Compound (XVI-5) is used as a light emitting material to form a light emitting layer to a thickness of 0.050 μm by a spin coating method. After the layers are sufficiently dried, Ca is deposited to a thickness of 0.08 μm, Al is deposited to a thickness of 0.15 and a back surface electrode having a width of 2 mm and a thickness of 0.23 μm is formed so as to intersect with the ITO electrode. The effective area of the organic electroluminescent element thus formed is 0.04 cm².

Example 9

On an ITO glass substrate which has been etched, washed and dried in the same manner as in Example 1, a layer of the Exemplary Compound (XV-16) is formed as a light emitting layer to a thickness of 0.050 μm. A 1.5% by weight dichloroethane solution of the charge transporting polyester [Exemplary Compound (15)] is prepared, and the solution is filtered

Comparative Example 2

Two parts by weight of polyvinylcarbazole (PVK) as a charge transporting polymer, 0.1 part by weight of the Exemplary Compound (XV-1) as a light emitting material, and 1 part by weight of the Compound (XV-9) as an electron transporting material are mixed to prepare a 10% by weight dichloroethane solution, and the solution is filtered through a 0.2-μm PTFE filter. On a glass substrate on which a strip-shaped ITO electrode having a width of 2 mm is formed by etching, a hole transport layer having a thickness of 0.15 μm is formed by applying the above solution by a dipping method. After the layers are sufficiently dried, LiF is deposited to a thickness of 0.0001 μm using a metal mask provided with strip-shaped holes, subsequently Al is deposited to a thickness of 0.150 μm, and a back surface electrode having a width of 2 mm and a thickness of 0.15 μm is formed so as to intersect with the ITO electrode. The effective area of the organic electroluminescent element thus formed is 0.04 cm².

Comparative Example 3

Two parts by weight of a compound having a structure represented by the following structural formula (XVIII) as a charge transporting polymer, 0.1 part by weight of the Exemplary Compound (XV-1) as a light emitting material, and 1 part by weight of the compound (XV-9) as an electron transporting material are mixed to prepare a 10% by weight dichloroethane solution, and the solution is filtered through a 0.1-

μm PTFE filter. On a glass substrate on which a strip-shaped ITO electrode having a width of 2 mm is formed by etching, a hole transport layer having a thickness of 0.15 μm is formed by applying the above solution by a dipping method. After the layers are sufficiently dried, LiF is deposited to a thickness of 0.0001 μm using a metal mask provided with strip-shaped holes, subsequently Al is deposited to a thickness of 0.150 μm, and a back surface electrode having a width of 2 mm and a thickness of 0.15 μm is formed so as to intersect with the ITO electrode. The effective area of the organic electroluminescent element thus formed is 0.04 cm².

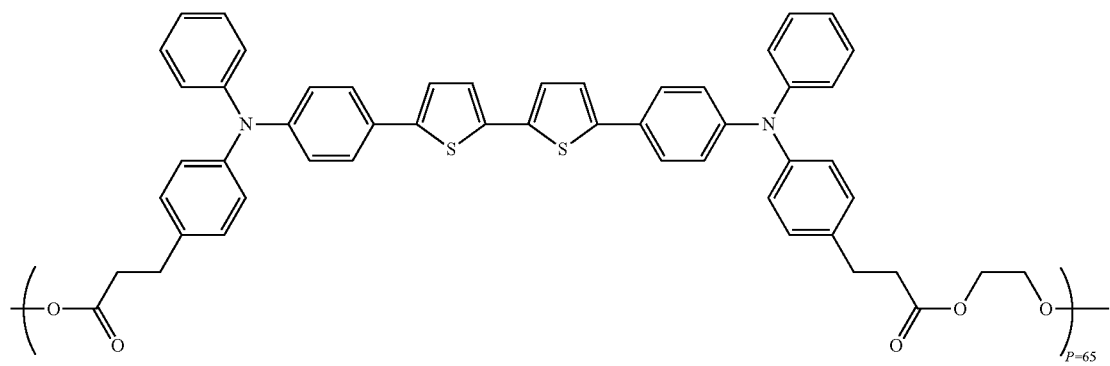

(XVIII)

For the organic EL elements produced as described above, a direct current voltage is applied in dry nitrogen by connecting the ITO electrode side as a positive electrode and the back surface electrode as a negative electrode, and measurements are made.

The evaluation of luminescence lifetime is carried out by setting the initial luminance to 1,000 cd/m² in a direct current driving system (DC driving) at room temperature (25° C.), and determining the relative time when the driving time at the time point at which the luminance of the element of Comparative Example 1 (initial luminance $L_0$: 1,000 cd/m²) reached luminance L/initial luminance $L_0$=0.5, is designated as 1.0, and the voltage increment (=voltage/initial driving voltage) at the time point at which the luminance of the element reached luminance L/initial luminance $L_0$=0.5. The results are shown in Table 9.

TABLE 9

|  | Voltage increase (@L/$L_0$ = 0.5) | Relative time (L/$L_0$ = 0.5) |
|---|---|---|
| Example 1 | 1.12 | 1.78 |
| Example 2 | 1.19 | 1.48 |
| Example 3 | 1.20 | 1.58 |
| Example 4 | 1.14 | 1.75 |
| Example 5 | 1.18 | 1.69 |
| Example 6 | 1.14 | 1.82 |
| Example 7 | 1.18 | 1.61 |
| Example 8 | 1.17 | 1.64 |
| Example 9 | 1.19 | 1.72 |
| Comparative Example 1 | 1.32 | 1.00 |
| Comparative Example 2 | 1.25 | 1.15 |
| Comparative Example 3 | 1.30 | 1.20 |

From the results shown in Table 9, it is understood that in the organic electroluminescent elements of Examples 1 to 9 using the charge transporting polyester according to the exemplary embodiment of the present invention, increase of voltage is suppressed as compared with the organic electroluminescent elements of Comparative Examples 1 to 3, and the luminescence lifetime is better than those using the conventional charge transporting polymers.

Furthermore, it is understood that in the organic electroluminescent elements according to the exemplary embodiment of the present invention, since the charge transporting polyester exhibits solubility in organic solvents, large-area organic electroluminescent elements may be easily produced.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An organic electroluminescent element comprising:
   a pair of electrodes including a positive electrode and a negative electrode, with at least one of the electrodes being transparent or semi-transparent; and
   an organic compound layer interposed between the pair of electrodes and containing one or more charge transporting polyesters represented by the following formula (I):

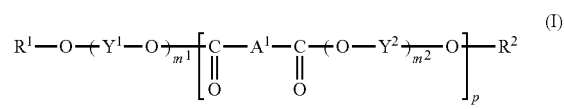

wherein in the formula (I),
$A^1$ represents at least one selected from structures represented by the following formula (II);
$Y^1$ and $Y^2$ each independently represent a substituted or unsubstituted divalent hydrocarbon group;
$m^1$ and $m^2$ each independently represent an integer of from 1 to 5;
p represents an integer of from 5 to 5,000; and
$R^1$ and $R^2$ each independently represent a hydrogen atom or a phenyl group;

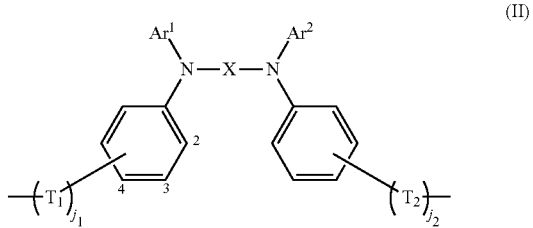

(II)

wherein in the formula (II), $Ar^1$ and $Ar^2$ each independently represent a substituted or unsubstituted phenyl group, a substituted or unsubstituted monovalent polynuclear aromatic hydrocarbon group having two aromatic rings, a substituted or unsubstituted monovalent condensed aromatic hydrocarbon group having two or three aromatic rings, or a substituted or unsubstituted monovalent aromatic heterocyclic group;

$j_1$ and $j_2$ each independently represent 0 or 1;

$T_1$ and $T_2$ each independently represent a divalent linear hydrocarbon group having from 1 to 6 carbon atoms, or a divalent branched hydrocarbon group having from 2 to 10 carbon atoms; and X represents a group represented by the following formula (III):

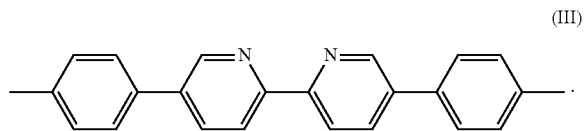

(III)

2. The organic electroluminescent element of claim 1, wherein the organic compound layer includes a light emitting layer and at least one layer of an electron transport layer and an electron injection layer, and at least one layer selected from the light emitting layer, the electron transport layer and the electron injection layer contains one or more charge transporting polyesters represented by the formula (I).

3. The organic electroluminescent element of claim 1, wherein the organic compound layer includes a light emitting layer and at least one layer of a hole transport layer and a hole injection layer, and at least one layer selected from the light emitting layer, the hole transport layer and the hole injection layer contains one or more charge transporting polyesters represented by the formula (I).

4. The organic electroluminescent element of claim 1, wherein the organic compound layer is a light emitting layer having a charge transport function, and the light emitting layer having a charge transport function contains one or more charge transporting polyesters represented by the formula (I).

5. The organic electroluminescent element of claim 1, wherein $Ar^1$ and $Ar^2$ in the formula (II) are the same.

6. The organic electroluminescent element of claim 1, wherein the weight average molecular weight Mw of the charge transporting polyester is in the range of from 5,000 to 300,000.

7. The organic electroluminescent element of claim 1, wherein p in the formula (I) is an integer in the range of from 10 to 1,000.

8. The organic electroluminescent element of claim 1, wherein the glass transition temperature (Tg) of the charge transporting polyester is in the range of from 60° C. to 300° C.

9. A display comprising the organic electroluminescent element of claim 1 arranged in at least one of a matrix form and a segment form.

10. A display comprising the organic electroluminescent element of claim 2 arranged in at least one of a matrix form and a segment form.

11. A display comprising the organic electroluminescent element of claim 3 arranged in at least one of a matrix form and a segment form.

12. A display comprising the organic electroluminescent element of claim 4 arranged in at least one of a matrix form and a segment form.

13. A display comprising the organic electroluminescent element of claim 6 arranged in at least one of a matrix form and a segment form.

14. A display comprising the organic electroluminescent element of claim 8 arranged in at least one of a matrix form and a segment form.

* * * * *